(12) United States Patent
Grant et al.

(10) Patent No.: US 12,394,660 B2
(45) Date of Patent: Aug. 19, 2025

(54) BURIED POWER RAIL AFTER REPLACEMENT METAL GATE

(71) Applicant: International Business Machines Corporation, Armonk, NY (US)

(72) Inventors: Devika Sarkar Grant, Rensselaer, NY (US); Sagarika Mukesh, Albany, NY (US); Kisik Choi, Watervliet, NY (US); Somnath Ghosh, Clifton Park, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 882 days.

(21) Appl. No.: 17/531,837

(22) Filed: Nov. 22, 2021

(65) Prior Publication Data
US 2023/0163020 A1 May 25, 2023

(51) Int. Cl.
*H10D 30/62* (2025.01)
*H01L 21/74* (2006.01)
(Continued)

(52) U.S. Cl.
CPC ...... *H01L 21/743* (2013.01); *H01L 21/76879* (2013.01); *H01L 23/5286* (2013.01); *H10D 84/013* (2025.01); *H10D 84/0149* (2025.01); *H10D 84/0151* (2025.01); *H10D 84/0158* (2025.01); *H10D 84/038* (2025.01); *H10D 84/834* (2025.01)

(58) Field of Classification Search
None
See application file for complete search history.

(56) References Cited

U.S. PATENT DOCUMENTS

| 8,507,957 B2 | 8/2013 | Hou |
| 9,570,395 B1 | 2/2017 | Sengupta |

(Continued)

FOREIGN PATENT DOCUMENTS

TW 202133444 A 9/2021

OTHER PUBLICATIONS

Gupta et al., "Buried Power Rail Integration With FinFETs for Ultimate CMOS Scaling", IEEE Transactions on Electronic Devices, vol. 67, No. 12, Dec. 2020, 6 pages.

(Continued)

*Primary Examiner* — Steven B Gauthier
*Assistant Examiner* — Lamont B Koo
(74) *Attorney, Agent, or Firm* — Gavin Giraud

(57) ABSTRACT

Embodiments herein include semiconductor structures with a first source/drain (S/D) connected to a first field-effect transistor (FET) region, a second S/D connected to a second FET region, and a buried power rail (BPR) region. The BPR region may include a BPR, a first dielectric liner lining a first lateral side of the BPR region, and a second dielectric liner lining a second lateral side. The first dielectric liner isolates the BPR from the first FET region and the first S/D, and the second dielectric liner isolates the BPR from the second FET region. Embodiments may also include a contact electrically connecting the second S/D and the BPR through a second lateral side of the BPR region. The liners enable the BPR to be formed after the formation of gates and the S/Ds, so that the BPR does not cause problems during annealing processes of the gates and the S/Ds.

17 Claims, 17 Drawing Sheets

(51) Int. Cl.
  *H01L 21/768* (2006.01)
  *H01L 23/528* (2006.01)
  *H10D 84/01* (2025.01)
  *H10D 84/03* (2025.01)
  *H10D 84/83* (2025.01)

(56) References Cited

U.S. PATENT DOCUMENTS

| | | |
|---|---|---|
| 10,586,765 B2 | 3/2020 | Smith |
| 10,636,739 B2 | 4/2020 | Beyne |
| 10,700,207 B2 | 6/2020 | Chen |
| 10,734,224 B2 | 8/2020 | Smith |
| 10,950,546 B1 | 3/2021 | Doornbos |
| 11,063,005 B2 | 7/2021 | Sio |
| 2020/0075574 A1 | 3/2020 | Smith |
| 2020/0098681 A1 | 3/2020 | Kim |
| 2020/0105603 A1 | 4/2020 | Chang |
| 2020/0105671 A1 | 4/2020 | Lai |
| 2020/0135634 A1 | 4/2020 | Chiang |
| 2020/0411436 A1 | 12/2020 | Xie |
| 2021/0082750 A1 | 3/2021 | Yu |
| 2021/0098306 A1 | 4/2021 | Smith |
| 2021/0134976 A1 | 5/2021 | Zhang |

OTHER PUBLICATIONS

Gupta et al., "Buried Power Rail Scaling and Metal Assessment for the 3 nm Node and Beyond", Proceedings of the 2020 IEEE International Electron Devices Meeting (IEDM), San Francisco, CA, Dec. 12-18, 2020, 4 pages.

Mallik et al., "Economics of semiconductor scaling—a cost analysis for advanced technology node", Proceedings of the 2019 Symposium on VLSI Technology Digest of Technical Papers, Printed Sep. 19, 2021, 2 pages.

Mathur et al., "Buried Bitline for sub-5nm SRAM Design", Proceedings of the 2020 IEEE International Electron Devices Meeting (IEDM), San Francisco, CA, Dec. 12-18, 2020, 4 pages.

Moroz et al., "Can We Ever Get to a 100 nm Tall Library? Power Rail Design for 1nm Technology Node", Proceedings of the 2020 IEEE Symposium on VLSI Technology, Honolulu, HI, Printed Sep. 19, 2021, 2 pages.

Prasad et al., "Buried Power Rails and Back-side Power Grids: Arm® CPU Power Delivery Network Design Beyond onm", Proceedings of the 2019 IEEE International Electron Devices Meeting (IEDM), San Francisco, CA, Dec. 9-11, 2019, 4 pages.

International Searching Authority, "Notification of Transmittal of the International Search Report and the Written Opinion of the International Searching Authority, or the Declaration", File Reference P202103564, International application No. PCT/EP2022/080312, International Filing Date Oct. 28, 2022, Mailed on Mar. 6, 2023, 11 pages.

Vincent, et al., "A Benchmark Study of Complementary-Field Effect Transistor (CFET) Process Integration options Done by Virtual Fabrication", Journal of the Electron Devices Society, vol. 8, 2020, Jul. 14, 2020, pp. 668-673.

BURIED POWER RAIL AFTER REPLACEMENT METAL GATE

BACKGROUND

The present invention relates generally to the field of fabrication of semiconductor devices, and more particularly to forming a buried power rail after formation of the replacement metal gate.

In fabricating semiconductor devices, millions of devices can be located together on a single substrate. Useful control of these millions of devices relies on the application of electrical signals to specific devices while insulting the electrical signals from shorting to anything else (e.g., other devices). Within standard logic cells, power rails in back-end of line (BEOL) metal layers deliver current to source/drains that power the individual devices (e.g., transistors). The power rails carry a higher current than standard routing tracks/signal lines to maintain adequate power distribution targets, and therefore require a larger space in the cell. In many designs, a power rail can be four times larger than a normal routing line.

Reducing a lateral dimension of the power rails and extending a vertical dimension deeper into the cell can keep the total metal volume in the power rail high while making room for other components. Increasing the depth of the power rail, however, can cause higher via resistance, or can cause the signal lines to carry increased capacitance between tracks in the BEOL. Burying the power rails underneath a physical device (e.g., transistor) enables the depth of the power rail to be increased independent of the signal lines in the BEOL. Buried power rails (BPR) provide significantly lower resistance through the power rail without driving any negative impact to either via resistance or capacitance in the BEOL.

In general, BPR formation occurs directly after fin (e.g., a nanosheet stack fin) formation in the semiconductor device. That is, after the fins are etched, and the shallow trench isolation (STI) layer is applied, then a trench is etched for the BPR. Forming a BPR trench directly after the STI provides for a BPR that remains 'buried' and out of the way from the gate, gate spacer, epi, metal layer contacts, and/or other components of the semiconductor structure. During formation of gate, gate spacer, epi, metal layer contacts, and other components, however, buried power rails of a semiconductor structure can suffer from thermal instability caused during annealing processes. Specifically, certain types of metal (e.g., cobalt) present in buried power rails can migrate and diffuse into other components of the semiconductor structure while the semiconductor structure is heated for annealing. Additionally or alternatively, the semiconductor structure can stress and/or bow the wafer due to the expansion and contraction of the metals during heating. This stress can be magnified over the many annealing cycles that can be used during fabrication.

SUMMARY

According to one embodiment of the present invention, a semiconductor structure is disclosed. The semiconductor structure may include a first source/drain (S/D) connected to a first field-effect transistor (FET) region, a second S/D connected to a second FET region, and a buried power rail (BPR) region extending laterally in a first direction, and located between the first FET region and the second FET region. The BPR region may include a buried power rail (BPR), a first dielectric liner lining a first lateral side of the BPR region, and a second dielectric liner lining a second lateral side of the BPR region. The first dielectric liner isolates the BPR from the first FET region and the first S/D, and the second dielectric liner isolates the BPR from the second FET region. The semiconductor structure may also include a contact electrically connecting the second S/D and the BPR through a second lateral side of the BPR region. The liners enable the BPR to be formed after the formation of gates and the S/Ds, so that the BPR does not cause problems during annealing processes of the gates and the S/Ds.

Embodiments of the present invention provide that the first FET region and the second FET region may be devices with a polarity of PFET or NFET. For the semiconductor structures in embodiments of the present invention the first dielectric liner and the second dielectric liner may connect below the BPR to isolate a lower portion of the BPR from a substrate. Isolating the BPR from the substrate reduces shorting that may otherwise occur.

Embodiments of the present invention may include a horizontal metal extension. The horizontal metal extension increases the electrical connectivity between the BPR and the contacts because the horizontal metal extension extends from the contact over a top surface of the BPR between the first dielectric liner and the second dielectric liner. Embodiments may also include a gate region adjacent to the first FET region and the second FET region along the BPR in the first direction, wherein at the gate region the first dielectric liner separates the BPR from a first gate, and the second dielectric liner separates the BPR from a second gate. The gate region may include an interlayer dielectric (ILD) between the first dielectric liner and the second dielectric liner and a horizontal metal extension located between the ILD and the BPR.

Embodiments of the present invention provide a method that may include forming a first gate and a second gate in a gate region of a semiconductor structure, forming a first source/drain (S/D) and a second S/D in a S/D region adjacent to the gate region, etching a buried power rail (BPR) region between the first gate and the second gate and between the first S/D and the second S/D, forming a first dielectric liner lining a first lateral side of the BPR region, forming a second dielectric liner lining a second lateral side of the BPR region, forming a BPR between the first dielectric liner and the second dielectric liner, and forming a contact opening through the second dielectric liner in the S/D region and at least part of the second S/D. Forming the BPR with that liners between the gates and the S/Ds (i.e., after the gates and the S/Ds are formed) enables the BPR to avoid causing problems during annealing processes used when forming the gates and the S/Ds.

Embodiments of the present invention provide a method that may include forming a first dielectric cap above the BPR before forming the ILD, and etching the first dielectric cap after etching the contact to form a horizontal metal extension region, and metalizing the horizontal metal extension region to form a horizontal metal extension. The horizontal metal extension increases the electrical connectivity between the BPR and the contacts because the horizontal metal extension extends from the contact over a top surface of the BPR between the first dielectric liner and the second dielectric liner. The methods may further include forming a deep shallow trench isolation (STI) before forming the first gate, the second gate, the first S/D, and the second S/D, wherein the deep STI surrounds a lower portion of the BPR to isolate the BPR from the substrate. Forming the deep STI enables the BPR to be isolated from the substrate and the FET regions without first forming a dielectric liner. In certain embodiments, the method may include forming a lower portion of the BPR below the first dielectric liner and the second dielectric liner, wherein the lower portion of the BPR is isolated from a substrate by the deep STI.

Embodiments of the present invention provide a method that may include a semiconductor structure with a BPR that is formed after the gates and the S/Ds to eliminate problems that could be caused by the BPR during the processes of forming the gates and the S/Ds, specifically the annealing processes. The semiconductor structure may include a gate region with a first dielectric liner between a first gate and a buried power rail (BPR), and a second dielectric liner between a second gate and the BPR. The semiconductor structure may also include a source/drain (S/D) region with the first dielectric liner between a first source/drain (S/D) and the BPR, and a second S/D contacting the BPR.

Embodiments of the present invention provide a method that may include a semiconductor structure with a first field-effect transistor (FET) region having a first source/drain (S/D) contact, a second FET region comprising a second S/D contact, a deep shallow trench isolation (STI) between the first FET region and the second FET region, and a buried power rail (BPR). A lower portion of the BPR may be isolated from the first FET region and the second FET region by the deep STI, and an upper portion of the BPR may be isolated from the first S/D contact by a first dielectric liner. The upper portion of the BPR may contact the second S/D contact.

Embodiments of the present invention provide a method that may include a forming a deep shallow-trench isolation (STI), forming a first field-effect transistor (FET) region comprising a first source/drain (S/D) and a second FET region comprising a second S/D, etching a buried power rail (BPR) region into the deep STI. A liner STI may remain at an exterior of the BPR region. The method may also include forming a lower portion of a BPR within the BPR region, wherein the liner STI isolates the BPR from the first FET region and the second FET region, forming a first dielectric liner lining a first lateral side of the BPR region above the BPR, and forming an upper portion of the BPR, wherein the first dielectric liner isolates the upper portion of the BPR from the first S/D.

DETAILED DESCRIPTION

Figure 1:
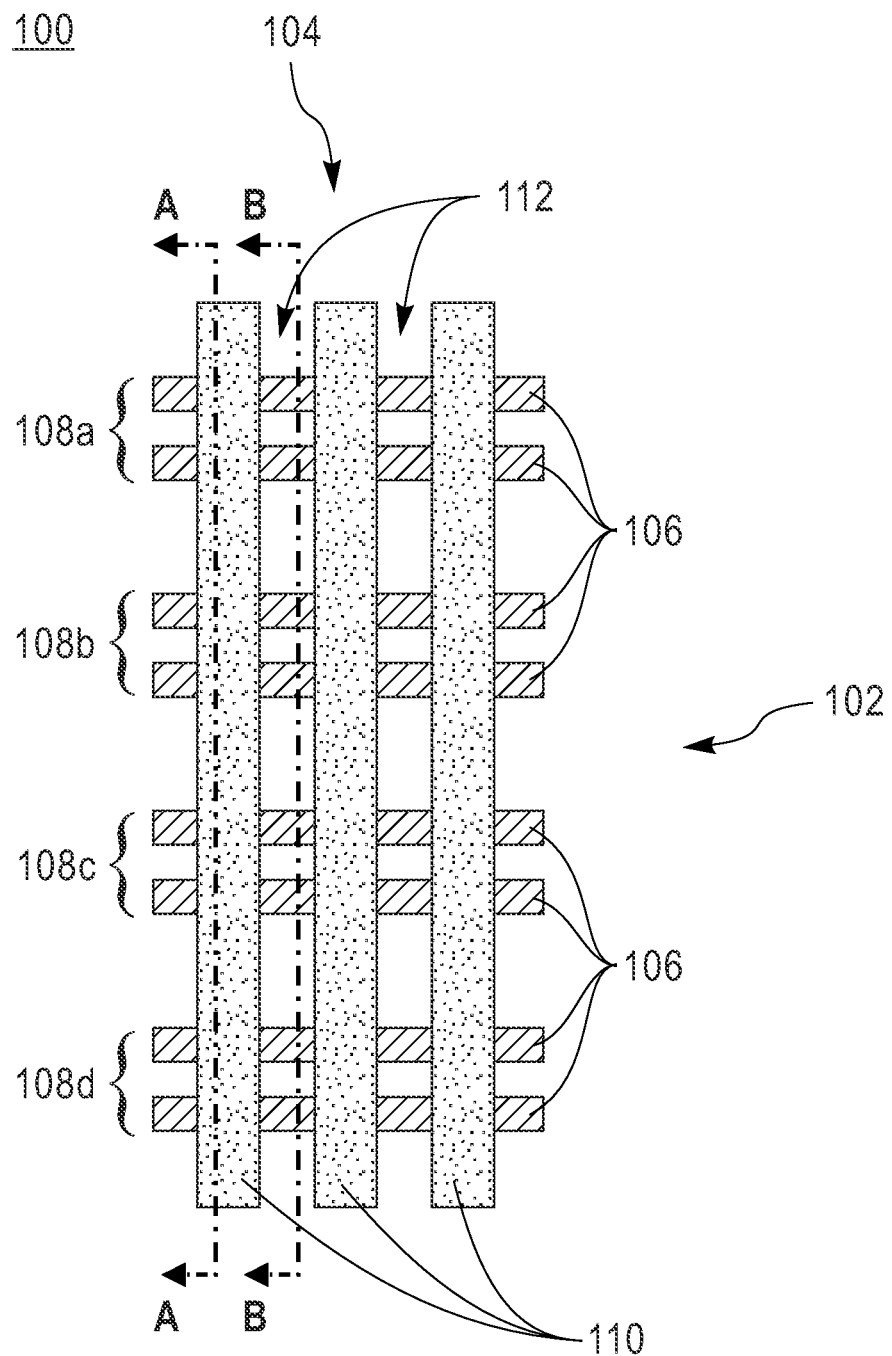
FIG. 1 is a schematic top view of a semiconductor structure, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

For integrated circuits, the masking, patterning, and etching of device components makes possible the fabrication of semiconductor devices at the micro and nano scale. As devices, components, and layers continually decrease in size and pitch, however, the etching techniques that have been used in the past can cause unintended consequences. In the examples mentioned above, buried power rails of a semiconductor structure can suffer from thermal instability caused during annealing processes. As metals migrate and diffuse into other components of the semiconductor structure during annealing, wafer yield and function can suffer. Furthermore, as mentioned above the semiconductor structure can stress and/or bow the wafer due to the expansion and contraction of the metals during heating, which can cause misalignment of subsequent processes which leads to reduced yield and function of the integrated circuit.

The devices and methods disclosed below address the problems associated with annealing the semiconductor structure and the buried power rail. Rather than fabricating the buried power rail right after fin formation, therefore, embodiments disclosed herein fabricate the buried power rail after dummy gate formation, after source/drain epitaxial formation, after dummy gate removal, and after high-κ metal gate formation.

FIG. 1 is a schematic top view of a semiconductor structure 100, in accordance with one embodiment of the present invention. The schematic view shows a relationship of rows 102 and columns 104 that will not necessarily be visible at any particular fabrication stage. The rows 102 may include fins 106 fabricated as part of a field-effect transistor (FET) region (e.g., n-type FET (NFET) and p-type FET (PFET)). The illustrated embodiment of the semiconductor structure 100 includes four FET regions: a first NFET region 108a, a second NFET region 108b, a first PFET region 108c, and a second PFET region 108d. The columns 104 include gate regions 110 and source/drain (S/D) region 112 that intersect buried power rail (BPR) regions described below. The following figures are cross-sectional side views taken in the gate region A-A and in the S/D region B-B at fabrication stages of the semiconductor structure 100.

Figure 2A:
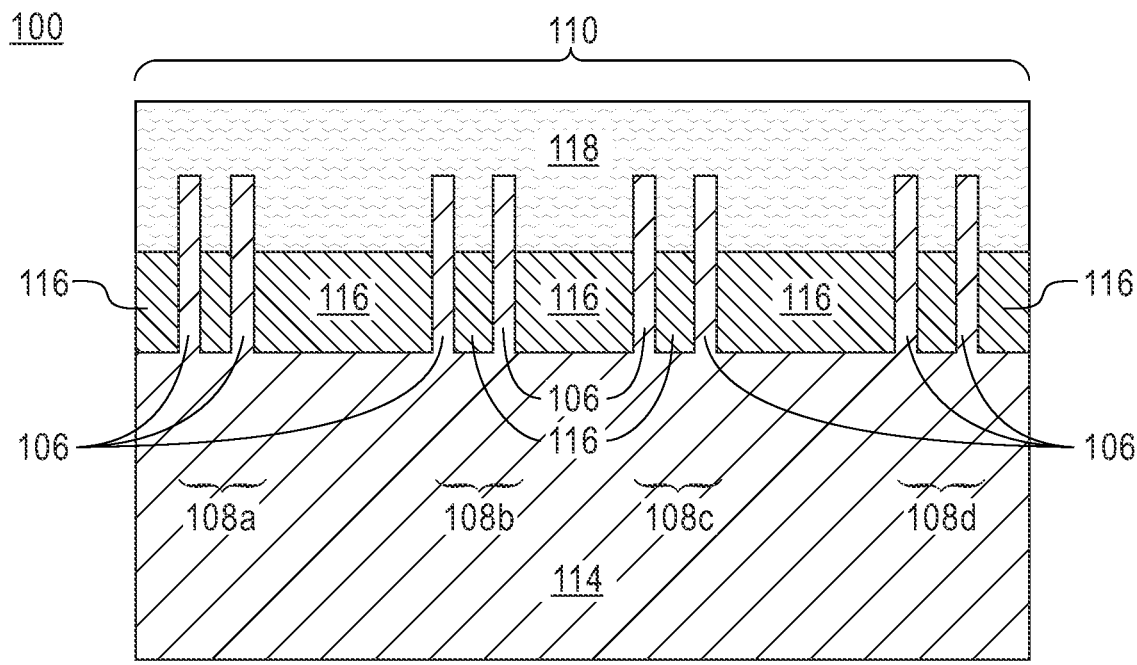
FIG. 2A is a schematic cross-sectional side view of the semiconductor structure of FIG. 1 at a subsequent fabrication stage, in accordance with one embodiment of the present invention.
Figure 2B:
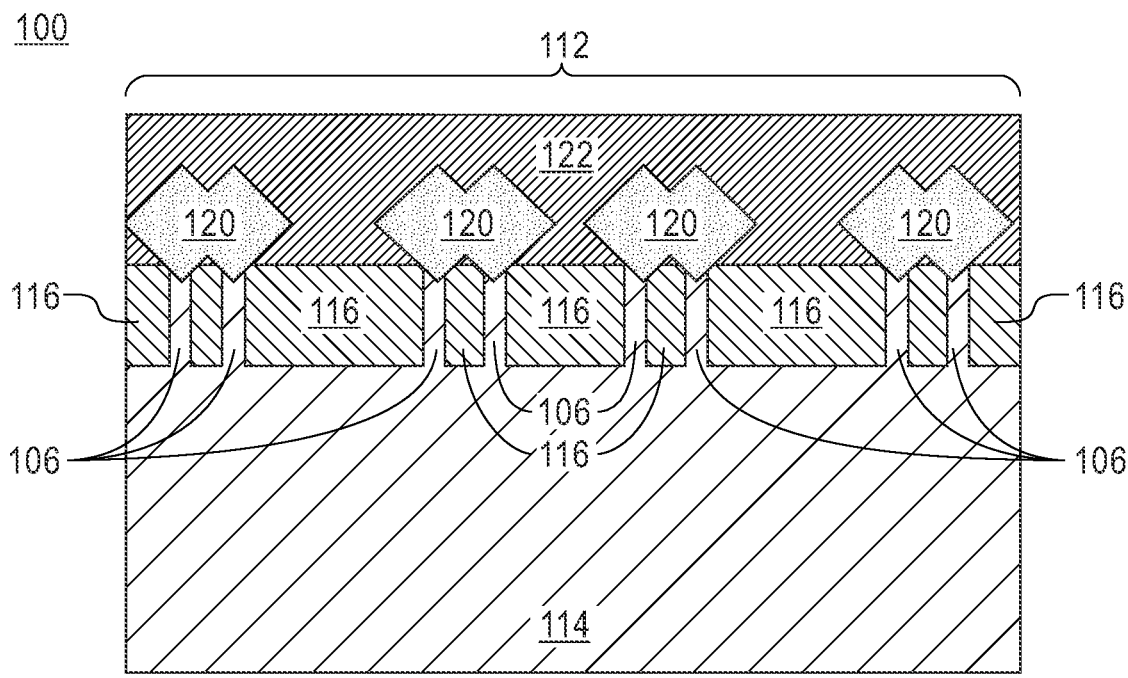
FIG. 2B is a schematic cross-sectional side view of the semiconductor structure of FIG. 1 at the same fabrication stage as FIG. 2A, in accordance with one embodiment of the present invention.

FIGS. 2A and 2B are schematic cross-sectional side views of the semiconductor structure 100 of FIG. 1, in accordance with one embodiment of the present invention. FIG. 2A is a view of the gate region 110, while FIG. 2B is a figure of the S/D region 112. The semiconductor structure 100 has fins 106 that extend laterally through the gate region 110 and the S/D region 112 (i.e., into and out of the page). A substrate 114 and shallow trench isolation (STI) 116 also extend along the length of the semiconductor structure 100 through the gate region 110 and the S/D region 112. The substrate 114, as explained above, may be doped with n-type doping or p-type doping depending on the FET region 108a, b, c, d. Particular to the gate region 110, the semiconductor structure 100 may include a gate 118 fabricated above the STI 116 and the fins 106. In the S/D region 112 the semiconductor structure 100 includes source/drains 120, and interlayer dielectric (ILD) 122. The annealing and curing for the gate 118 and the S/Ds 120 is completed at the fabrication stage illustrated in FIGS. 2A and 2B, and the metal contamination, metal diffusion, and wafer bowing that could occur due to the presence of a buried power rail have been avoided because no buried power rail is present during high thermal processing steps such as S/D epi growth, high-κ reliability anneal.

Figure 3A:
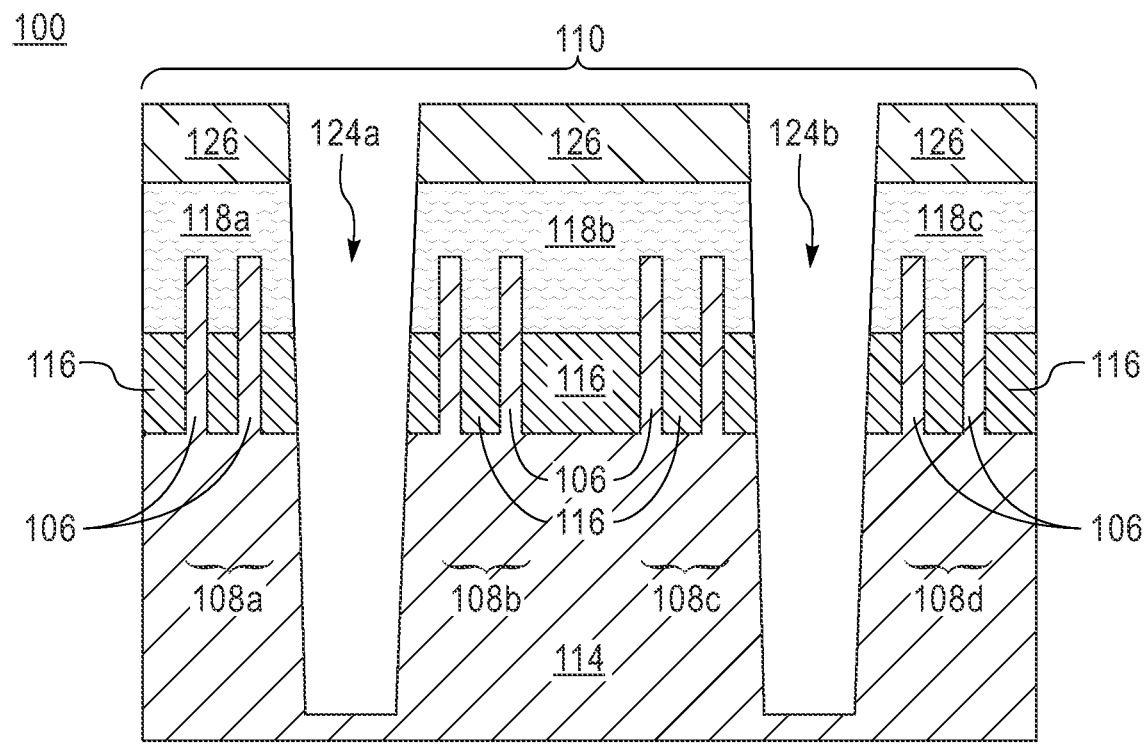
FIG. 3A is a schematic cross-sectional side view of the semiconductor structure of FIG. 1 at a subsequent fabrication stage, in accordance with one embodiment of the present invention.
Figure 3B:
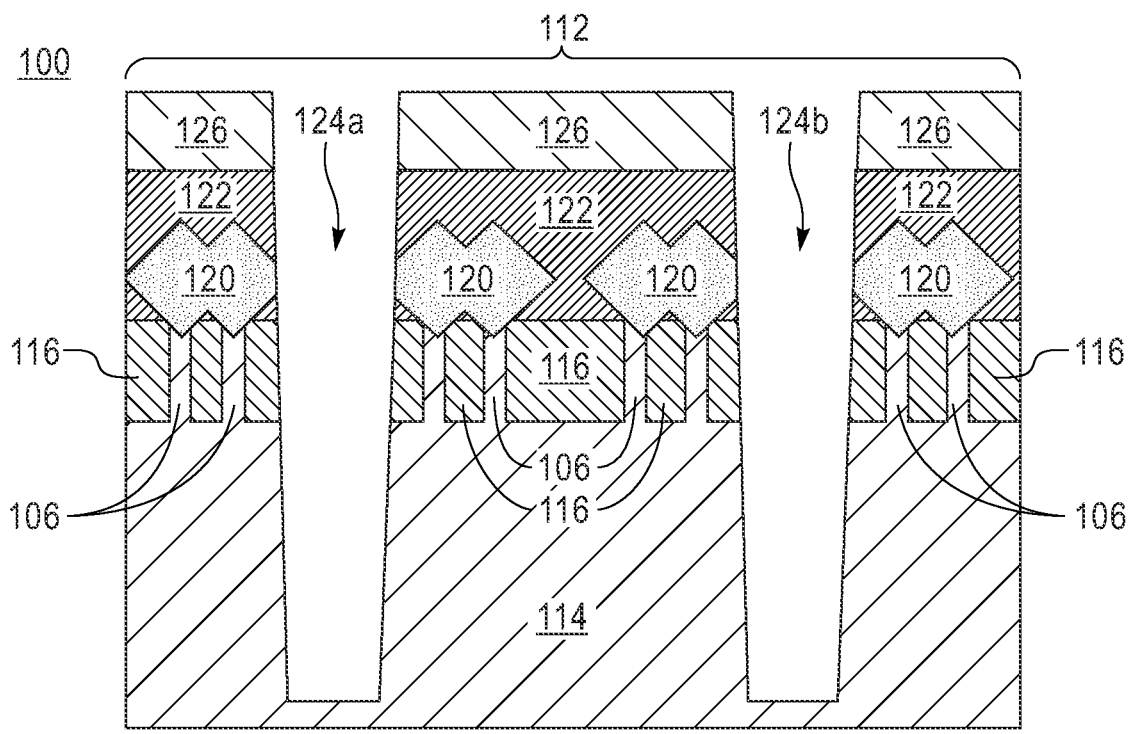
FIG. 3B is a schematic cross-sectional side view of the semiconductor structure of FIG. 1 at the same fabrication stage as FIG. 3A, in accordance with one embodiment of the present invention.

FIGS. 3A and 3B are schematic cross-sectional side views of the semiconductor structure of FIG. 1 at a subsequent fabrication stage, in accordance with one embodiment of the present invention. FIGS. 3A and 3B show buried power rail (BPR) regions 124a, b cut through the length of the semiconductor structure 100. Since the BPR regions 124a, b are continuous along the length of the semiconductor structure 100, the gate region 110 and the S/D region 112 are adjacent, and intersect the same first BPR region 124a and the same second BPR region 124b. The BPR regions 124a, b may be etched using a patterned hard mask layer 126. The hard mask layer 126 may be patterned (e.g., using lithography) so that the BPR regions 124a, b may be subsequently formed through an etching process. In some embodiments, this etching can be performed using an anisotropic etch such as reactive ion etching (RIE). The hard mask layer 126 resists etching and can be utilized to form the desired shape of the BPR regions 124.

The BPR regions 124a, b are formed between FET regions 108. In the illustrated embodiment of FIGS. 3A and 3B, the first BPR region 124a is formed between the first FET region 108a and the second FET region 108b, which are both NFET devices. Likewise, the second BPR region 124b is formed between the third FET region 108c and the fourth FET region 108d, which are both PFET devices. Other embodiments may be conceived in which the BPR regions 124a, b are formed between FET regions 108 that differ in doping type. The BPR regions 124a, b also cut the gate 118 so that a first gate 118a, a second gate 118b, and a third gate 118c are formed.

Figure 4A:
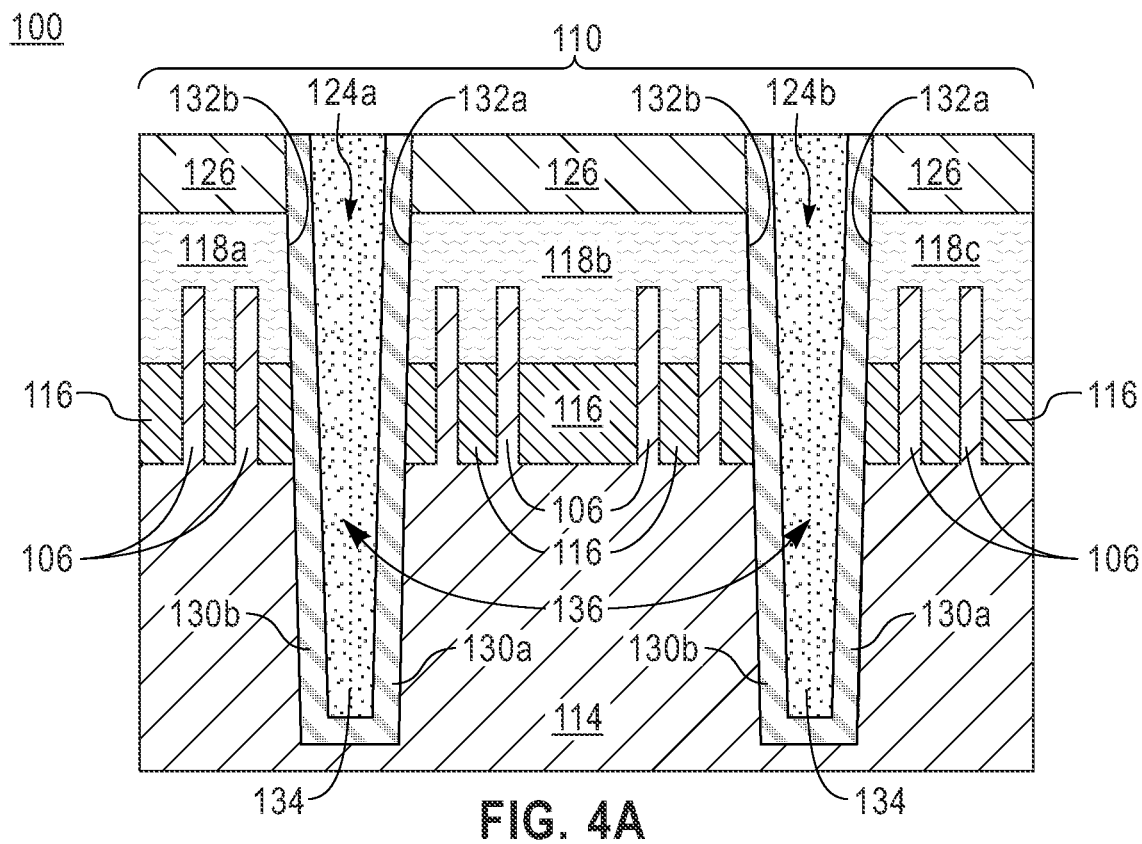
FIG. 4A is a schematic cross-sectional side view of the semiconductor structure of FIG. 1 at a subsequent fabrication stage, in accordance with one embodiment of the present invention.
Figure 4B:
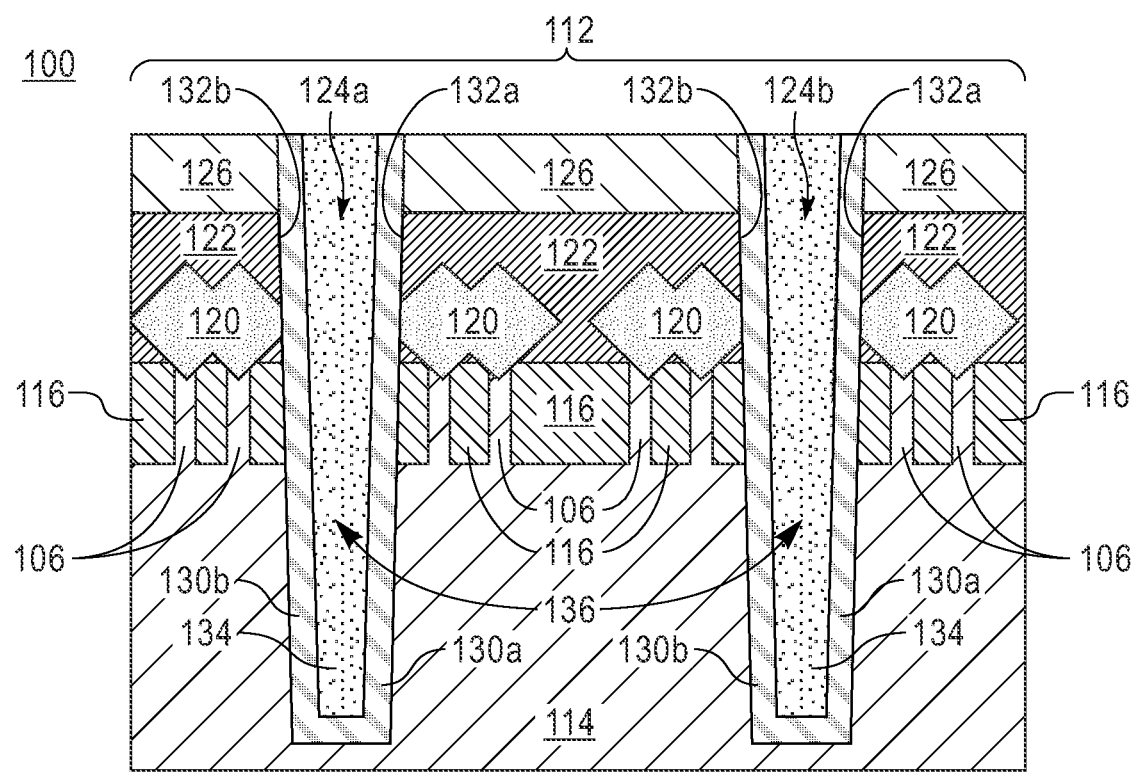
FIG. 4B is a schematic cross-sectional side view of the semiconductor structure of FIG. 1 at the same fabrication stage as FIG. 4A, in accordance with one embodiment of the present invention.

FIGS. 4A and 4B are schematic cross-sectional side views of the semiconductor structure 100 of FIG. 1 at a subsequent fabrication stage, in accordance with one embodiment of the present invention. The semiconductor structure 100 includes a first dielectric liner 130a on a first side 132a of each BPR region 124a, b, a second dielectric liner 130b on a second side 132b of each BPR region 124a, b, and a buried power rail (BPR) 134 formed between the first dielectric liner 130a and the second dielectric liner 130b. As illustrated, the first dielectric liner 130a and the second dielectric liner 130b may contact at a bottom of the BPR regions 124a, b, which isolates and insulates a lower portion 136 of the BPR 134 from the substrate 114. The dielectric liner 130a, b also isolate the BPR 134 from the S/D epi 120, and gate 118. The dielectric liners 130a, b extend laterally and continuously so that there is no break in the dielectric liners 130a, b between the gate region 110 and the S/D region 112.

The dielectric liners 130a, b may be deposited as a blanket layer over all of the semiconductor structure 100. The deposition may utilize atomic layer deposition (ALD), such that the dielectric liners 130a, b may form a uniform nano-scale layer within the BPR regions 124a, b. The dielectric liners 130a, b may be formed of SiN, SiBCN, SiOCN, SiOC, SiC, etc., which insulates the BPR 134 from the rest of the semiconductor structure 100. In particular, the dielectric liners 130a, b may contact the gates 118 or the S/Ds 120 without effecting the operation of the semiconductor structure 100. The BPR 134 may include a conductive material such as metal. In particular, the BPR 134 may be formed of a metal such as, for example, tungsten, cobalt, ruthenium, tantalum, copper, or alloys comprising carbon. Additionally, a thin metal adhesion liner can be formed prior to the conductive metal deposition, such as a thin layer of titanium nitride. After deposition of the dielectric liner 130a, b and BPR metal 134 deposition, a CMP process is used to polish the material over the patterning hardmask 126.

Figure 5A:
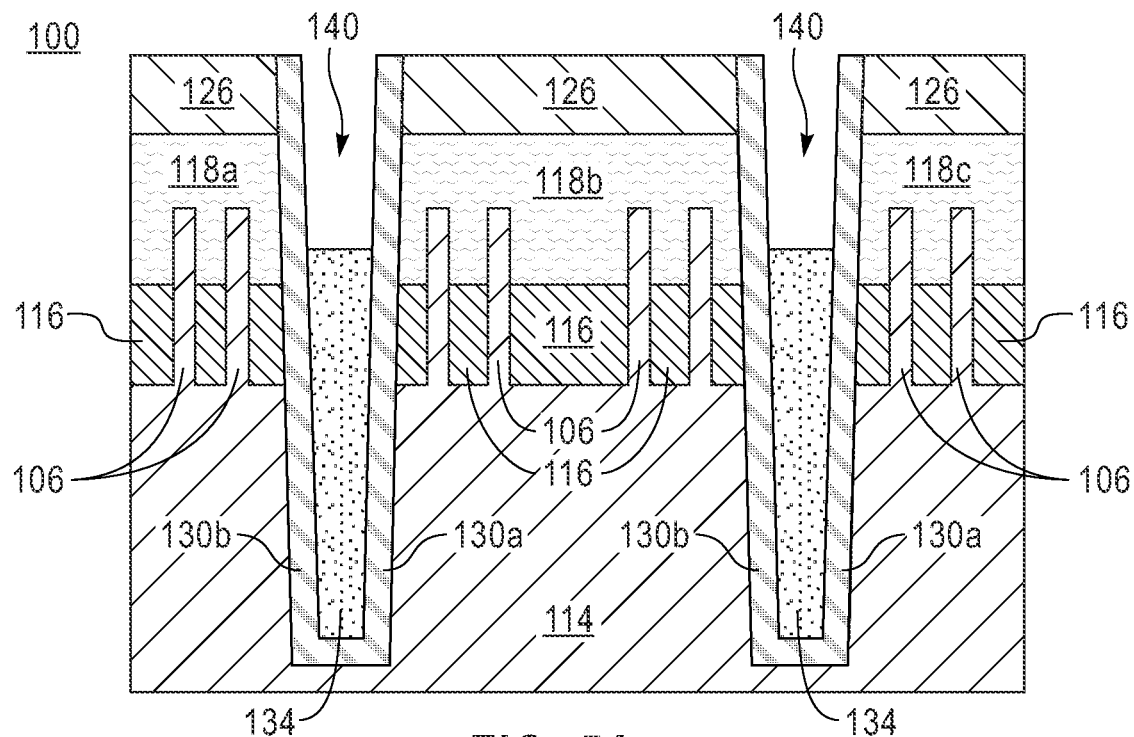
FIG. 5A is a schematic cross-sectional side view of the semiconductor structure of FIG. 1 at a subsequent fabrication stage, in accordance with one embodiment of the present invention.
Figure 5B:
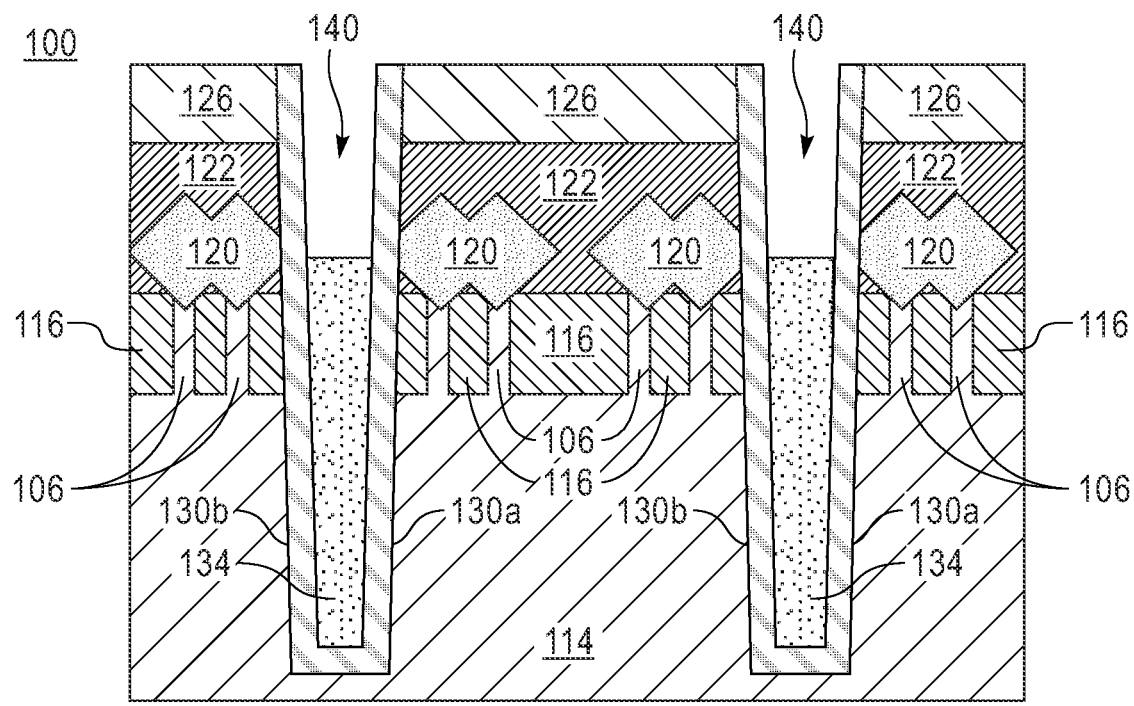
FIG. 5B is a schematic cross-sectional side view of the semiconductor structure of FIG. 1 at the same fabrication stage as FIG. 5A, in accordance with one embodiment of the present invention.

FIGS. 5A and 5B are schematic cross-sectional side views of the semiconductor structure 100 of FIG. 1 at a subsequent fabrication stage, in accordance with one embodiment of the present invention. The semiconductor structure 100 has the BPR 134 recessed from a recession 140 within the dielectric liners 130a, b. The BPR 134 may be etched using a selective etch. Selective in the context of this application means that the etch process etches one material significantly faster than another material. In the instance illustrated in FIGS. 5A and 5B, the selective etch process etches the conductive material of the BPR 134 significantly faster than the exposed portions of the dielectric liners 130a, b or the hard mask layer 126. The amount of recessing of the BPR 134 may change depending on the embodiment, and a recession 140 that is larger or smaller than the illustrated embodiment will not diverge from the disclosed embodiments herein.

Figure 6A:
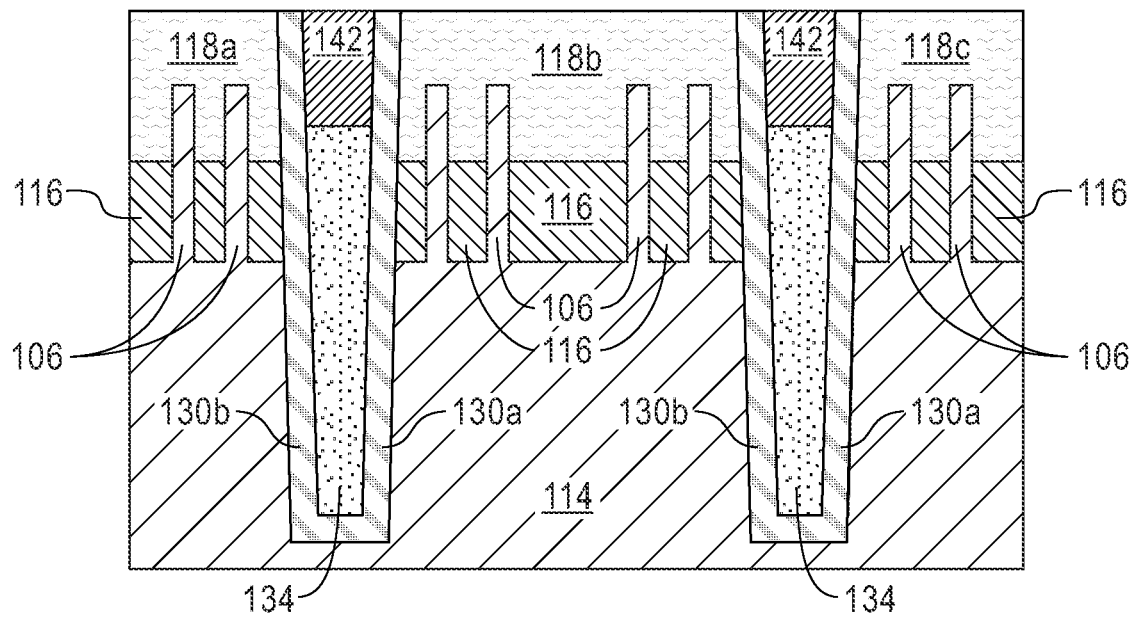
FIG. 6A is a schematic cross-sectional side view of the semiconductor structure of FIG. 1 at a subsequent fabrication stage, in accordance with one embodiment of the present invention.
Figure 6B:
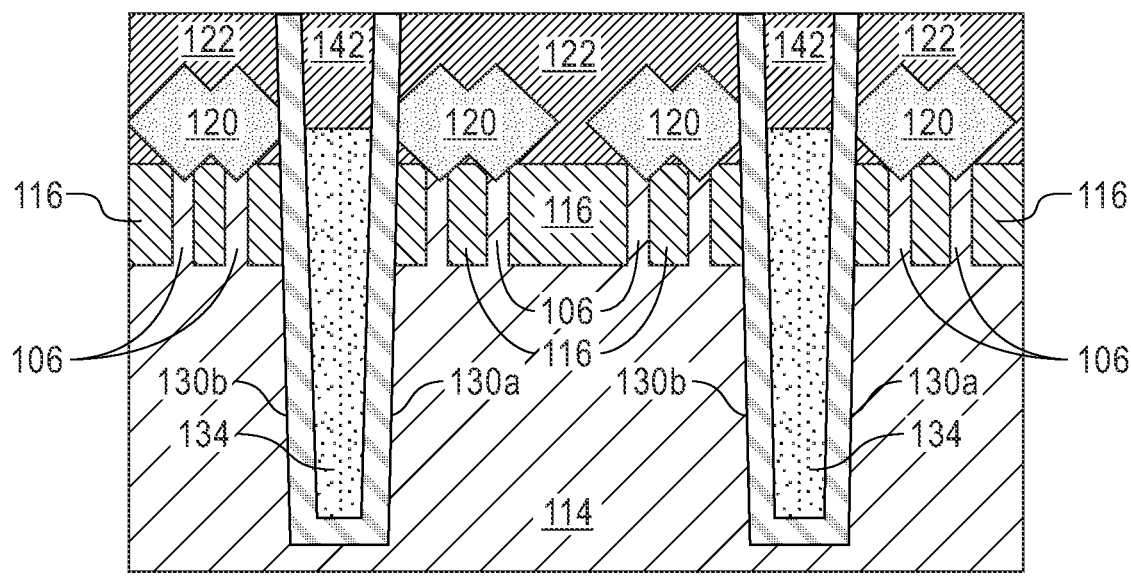
FIG. 6B is a schematic cross-sectional side view of the semiconductor structure of FIG. 1 at the same fabrication stage as FIG. 6A, in accordance with one embodiment of the present invention.

FIGS. 6A and 6B are schematic cross-sectional side views of the semiconductor structure 100 of FIG. 1 at a subsequent fabrication stage, in accordance with one embodiment of the present invention. FIGS. 6A and 6B show the recession 140 filled with a dielectric fill 142 that covers the BPR 134. The semiconductor structure 100 is then planarized (e.g., chemical-mechanical planarization (CMP)) to remove the hard mask layer 126. The dielectric fill 142 may include the same, or similar, material to the ILD 122. The ILD 122 and the dielectric fill 142 may be etch selective to the dielectric liners 130a, b.

Figure 7A:
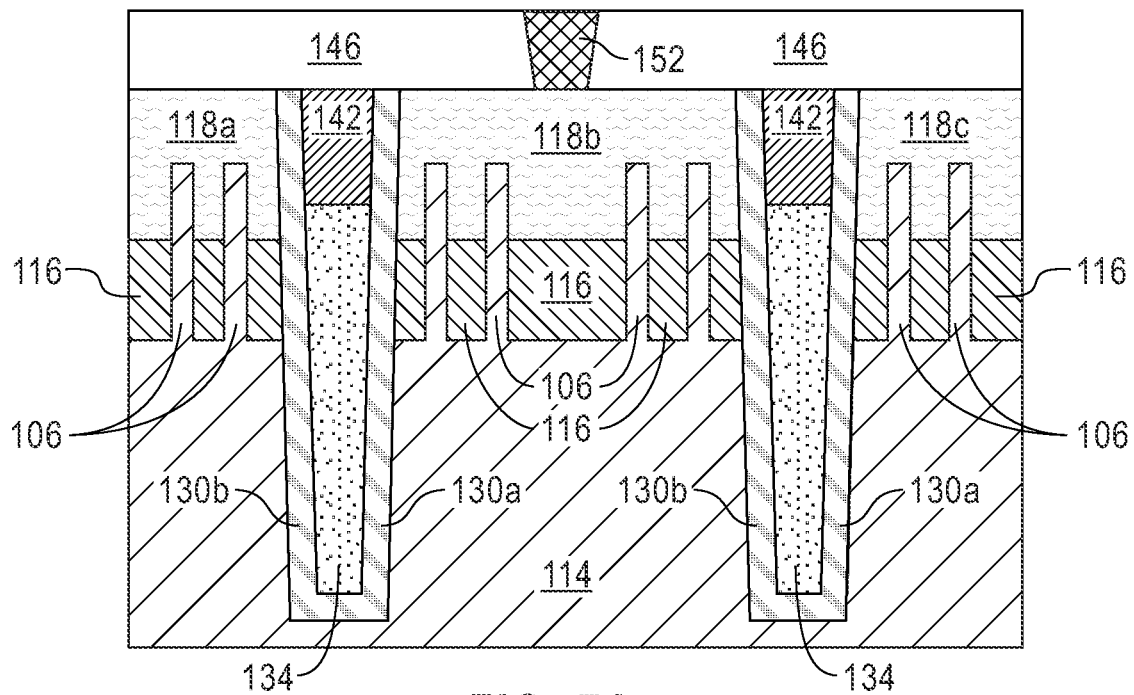
FIG. 7A is a schematic cross-sectional side view of the semiconductor structure of FIG. 1 at a subsequent fabrication stage, in accordance with one embodiment of the present invention.
Figure 7B:
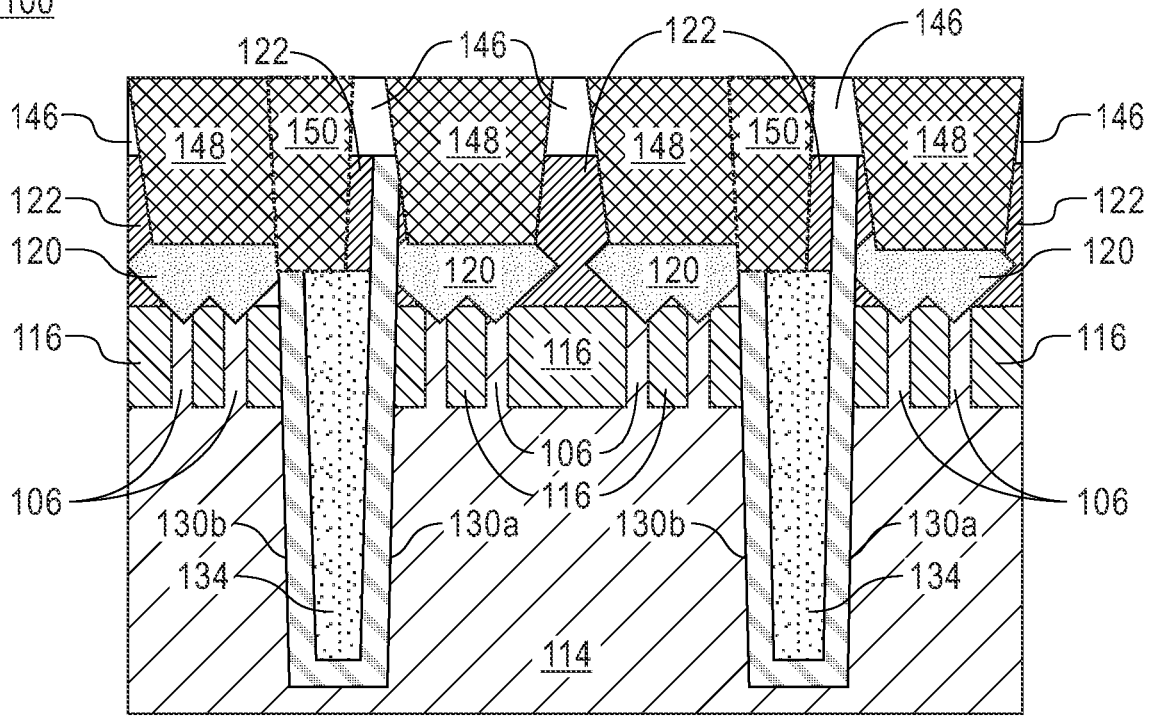
FIG. 7B is a schematic cross-sectional side view of the semiconductor structure of FIG. 1 at the same fabrication stage as FIG. 7A, in accordance with one embodiment of the present invention.

FIGS. 7A and 7B are schematic cross-sectional side views of the semiconductor structure 100 of FIG. 1 at a subsequent fabrication stage, in accordance with one embodiment of the present invention. FIGS. 7A and 7B show a second ILD 146 deposited as a blanket layer over the ILD 122, the dielectric liners 130a, b, and the dielectric fill 142. The second ILD 146 may include the same or similar material to the ILD 122, or may have a different composition or deposition process. After deposition of the second ILD 146, the semiconductor structure 100 includes S/D contacts 148, BPR contacts 150, and gate contacts 152 etched through the ILDs 146, 122 to contact, respectively, the S/Ds 120, the BPR 134, and the gate (i.e., the second gate 118b). The BPR contacts 150 replace the second dielectric liner 130b in the S/D region 112 (i.e., the second dielectric liner 130b is absent in the S/D region 112). The S/D contacts 148 are thus able to deliver/receive electrical signal to/from the S/Ds 120 depending on the charge delivered to the gates 118a, b, c, and the BPRs 134 is able to supply power to the semiconductor structure 100 through the BPR contacts 150.

The contacts 148, 150, 152 may be formed from electrically conductive materials, such as metals. The S/D contacts 148 and the BPR contacts 150 may be patterned with different mask materials (not shown), but in certain embodiments may be formed using one deposition process whereby the conductive material of the contacts 148, 150 is added to the S/D contact 148 location and the BPR contact 150 location simultaneously. In certain embodiments, the S/D contacts 148 are patterned and formed independently of the BPR contacts 150. The contact metal comprises a silicide liner, such as Ti, Ni, NiPt, etc., and a metal adhesion liner, such as TiN and conductive metals, such as Ru, W, Co, etc. After metal deposition, a CMP process is used to remove excessive metals over the ILD 146.

Figure 8A:
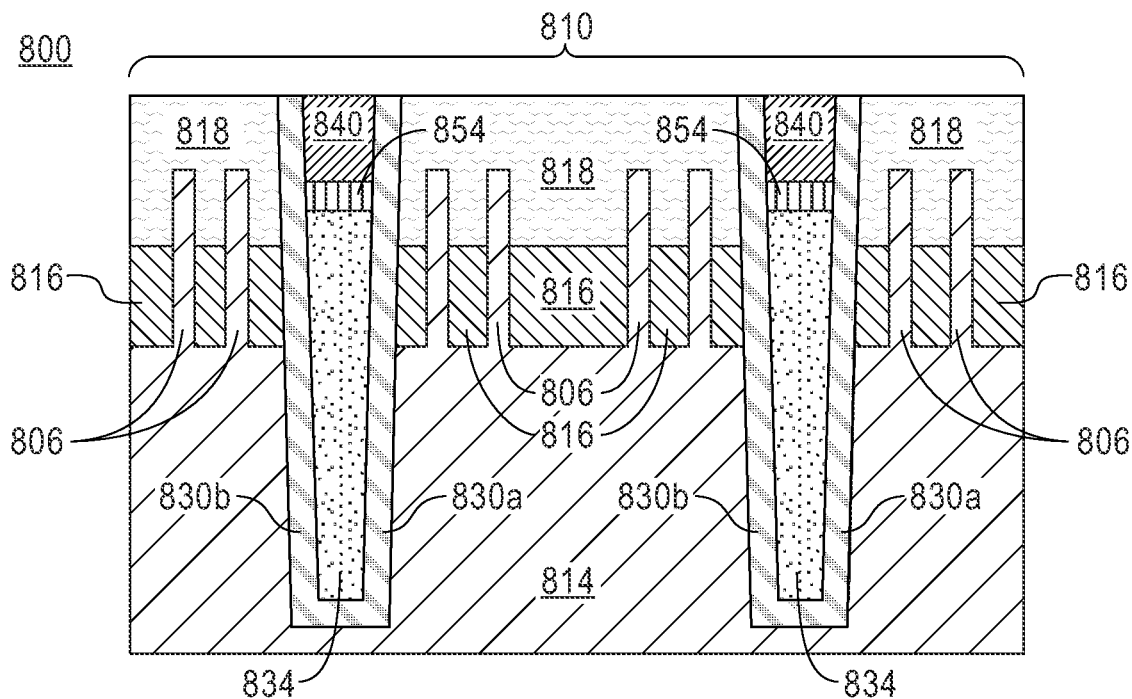
FIG. 8A is a schematic cross-sectional side view of the semiconductor structure of FIGS. 5A and 5B at a subsequent fabrication stage, in accordance with one embodiment of the present invention.
Figure 8B:
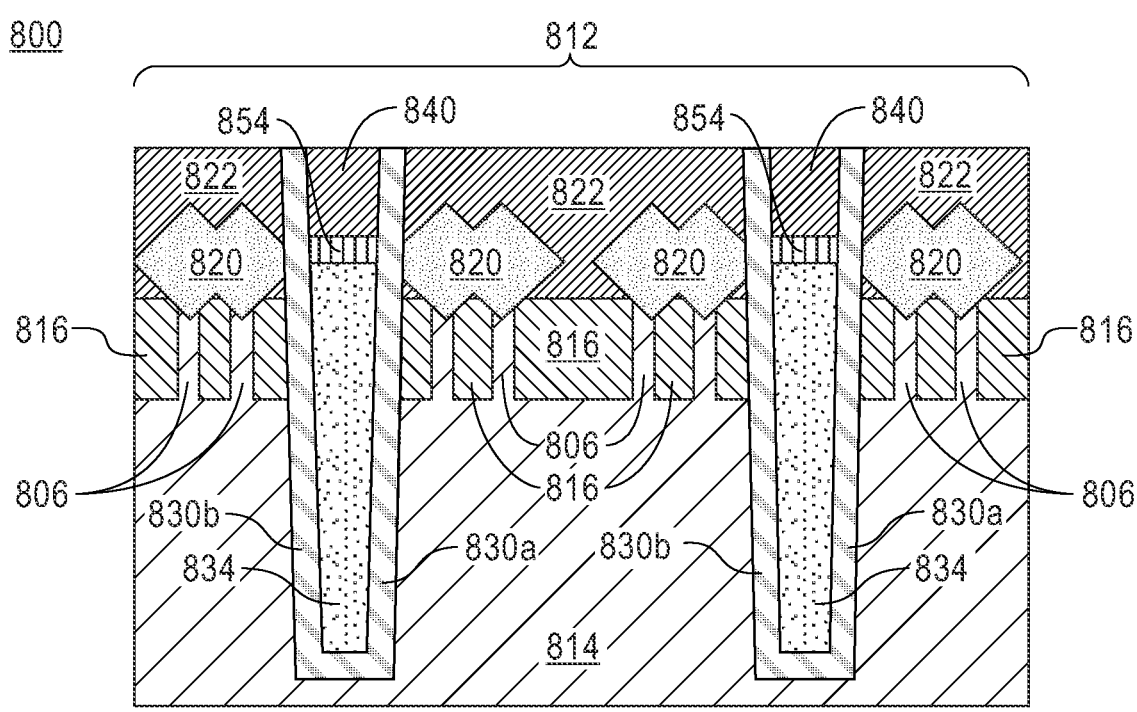
FIG. 8B is a schematic cross-sectional side view of the semiconductor structure of FIGS. 5A and 5B at the same fabrication stage as FIG. 8A, in accordance with one embodiment of the present invention.

FIGS. 8A and 8B are schematic cross-sectional side views of a semiconductor structure 800 at a fabrication stage following FIGS. 5A and 5B, in accordance with one embodiment of the present invention. FIG. 8A is a view of a gate region 810, while FIG. 8B is a figure of an S/D region 812. The semiconductor structure 800 has fins 806 that extend laterally through the gate region 810 and the S/D region 812 (i.e., as depicted in the Figures, into and out of the page). A substrate 814 and shallow trench isolation (STI) 816 also extend along the length of the semiconductor structure 800 through the gate region 810 and the S/D region 812. The substrate 814, as explained above, may be doped with n-type doping or p-type doping. Particular to the gate region 810, the semiconductor structure 800 may include a gate 818 fabricated above the STI 816 and the fins 806. In the S/D region 812 the semiconductor structure 800 includes source/drains 820, and interlayer dielectric (ILD) 822. The annealing and curing for the gate 818 and the S/Ds 820 is completed at the fabrication stage illustrated in FIGS. 2A and 2B, and the metal contamination, metal diffusion, and wafer bowing that could occur due to the presence of a buried power rail have been avoided. Rather than filling the recession 140 illustrated in FIGS. 5A and 5B with one material, the semiconductor structure 800 of FIGS. 8A and 8B includes a dielectric cap 854 formed before a dielectric fill 842. The dielectric cap 854 is thus located between the dielectric fill 842 and a BPR 834, and the BPR 834, the dielectric cap 854, and the dielectric fill 842 are all located between a first liner 830a and a second liner 830b. The first liner 830a and the second liner 830b isolate the BPR 834 from a substrate 814.

Figure 9A:
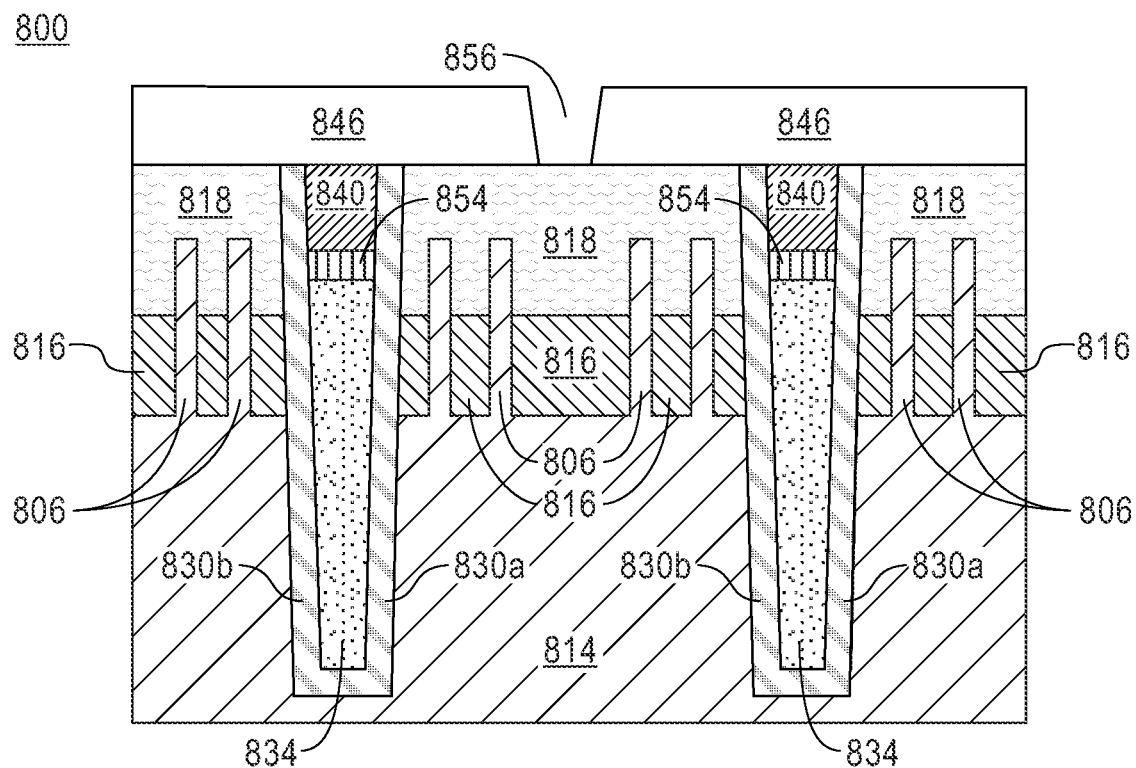
FIG. 9A is a schematic cross-sectional side view of the semiconductor structure of FIGS. 8A and 8B at a subsequent fabrication stage, in accordance with one embodiment of the present invention.
Figure 9B:
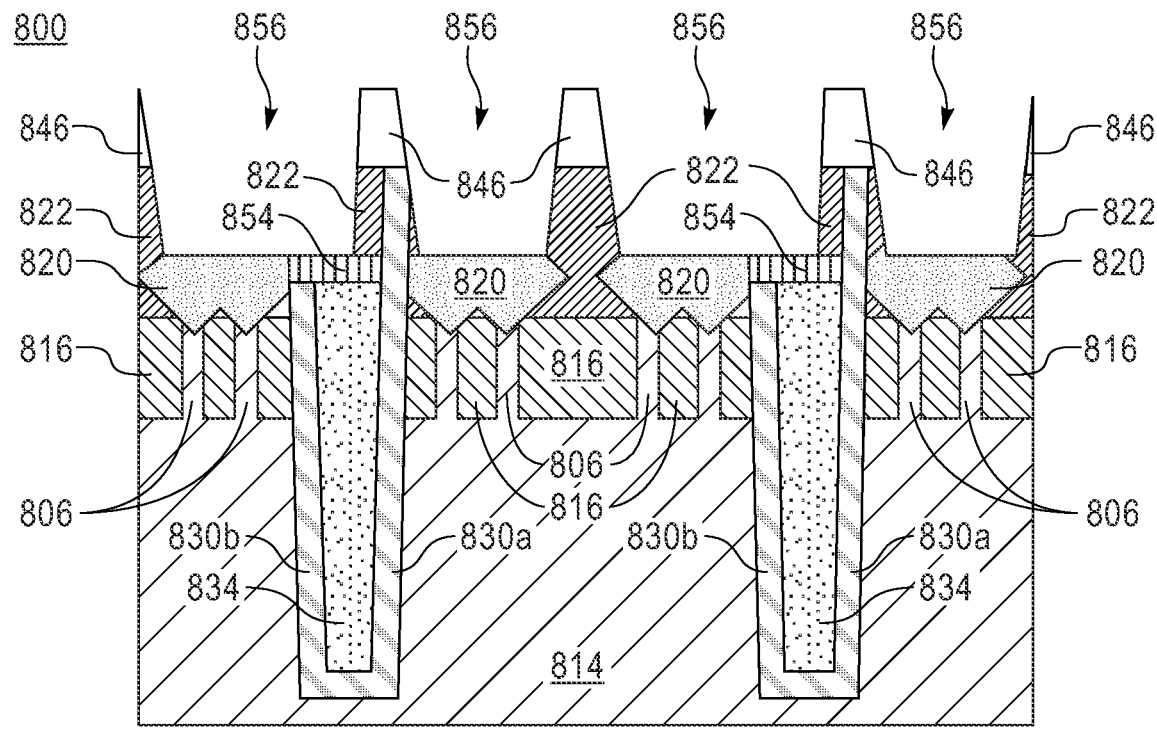
FIG. 9B is a schematic cross-sectional side view of the semiconductor structure of FIGS. 8A and 8B at the same fabrication stage as FIG. 9A, in accordance with one embodiment of the present invention.

FIGS. 9A and 9B are schematic cross-sectional side views of the semiconductor structure 800 of FIGS. 8A and 8B at a subsequent fabrication stage, in accordance with one embodiment of the present invention. The semiconductor structure 800 has contact openings 856 that are made preparatory to the formation of contacts similar to the contacts (i.e., S/D contacts 148, BPR contacts 150, and gate contacts 152 of FIGS. 7A and 7B) described above. The contact openings 856 are formed through an interlayer dielectric (ILD) 822 and a second ILD 846 to contact source/drains (S/Ds) 820, a buried power rail (BPR) 834, and a gate 818. In a change from the embodiments described above, however, a S/D contact opening 856 is etched and/or patterned wide enough to expose the dielectric cap 854. Therefore, the semiconductor structure 800 does not include a BPR contact opening, and the steps/masks needed to make that contact may be skipped during the fabrication of the semiconductor structure 800. Other embodiments of the semiconductor structure 800 may include both the dielectric cap 854 and a BPR contact opening.

Figure 10A:
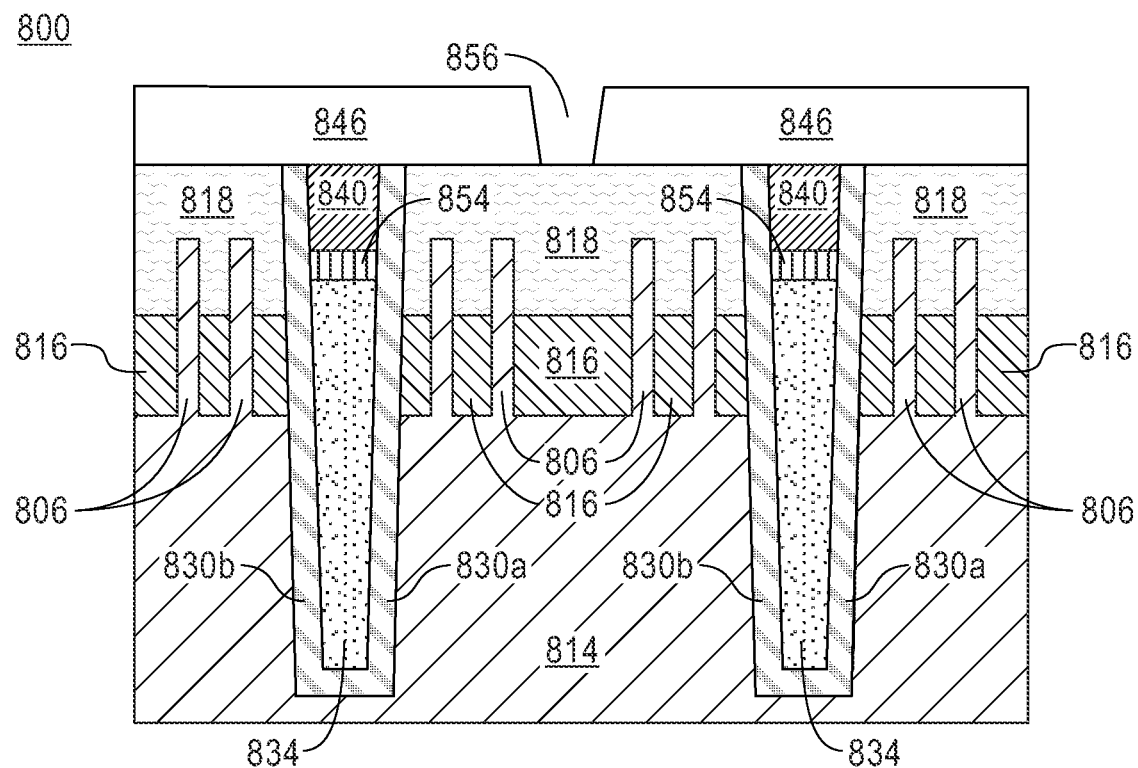
FIG. 10A is a schematic cross-sectional side view of the semiconductor structure of FIGS. 8A and 8B at a subsequent fabrication stage, in accordance with one embodiment of the present invention.
Figure 10B:
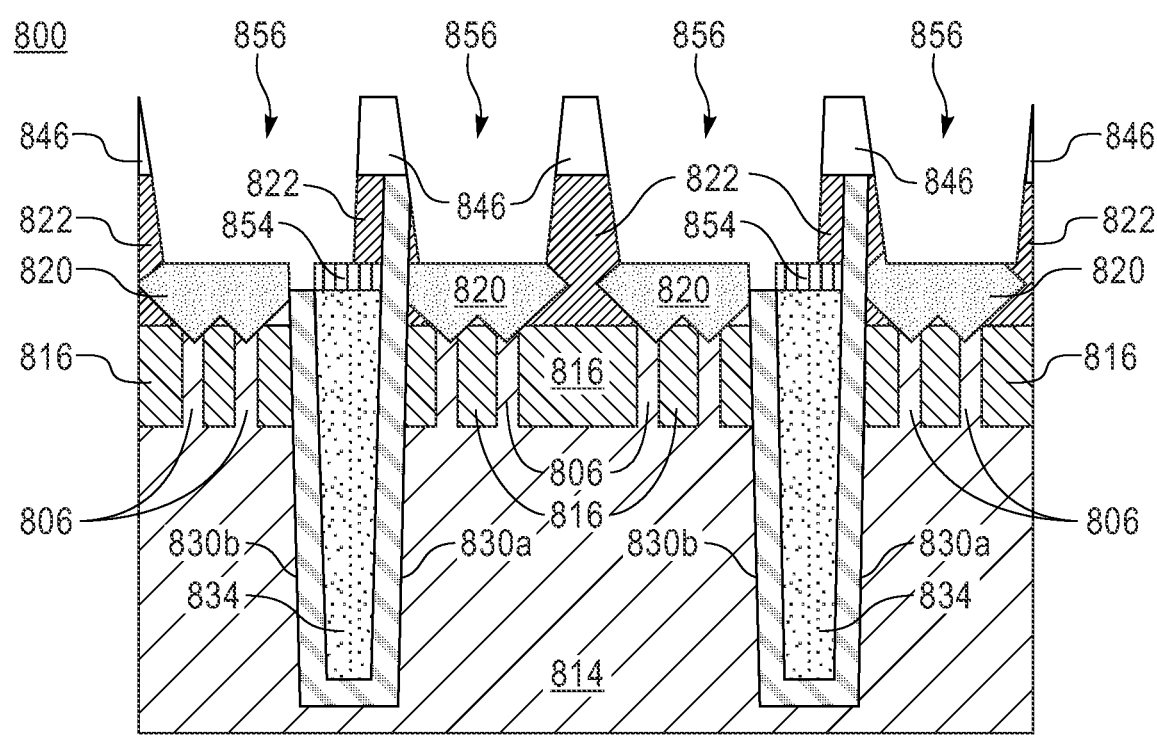
FIG. 10B is a schematic cross-sectional side view of the semiconductor structure of FIGS. 8A and 8B at the same fabrication stage as FIG. 10A, in accordance with one embodiment of the present invention.

FIGS. 10A and 10B are schematic cross-sectional side views of the semiconductor structure 800 of FIGS. 8A and 8B at a subsequent fabrication stage, in accordance with one embodiment of the present invention. The semiconductor structure 800 includes a liner recession 858 that is etched after the contact openings 856. The liner recession 858 is etched into the second dielectric liner 830b using a selective etch process that etches the second dielectric liner 830b without etching the other exposed components of the semiconductor structure 800. Etching the liner recession 858 exposes a greater portion of the dielectric cap 854 so that the dielectric cap 854 may be more easily etched, as shown in FIGS. 11A and 11B.

Figure 11A:
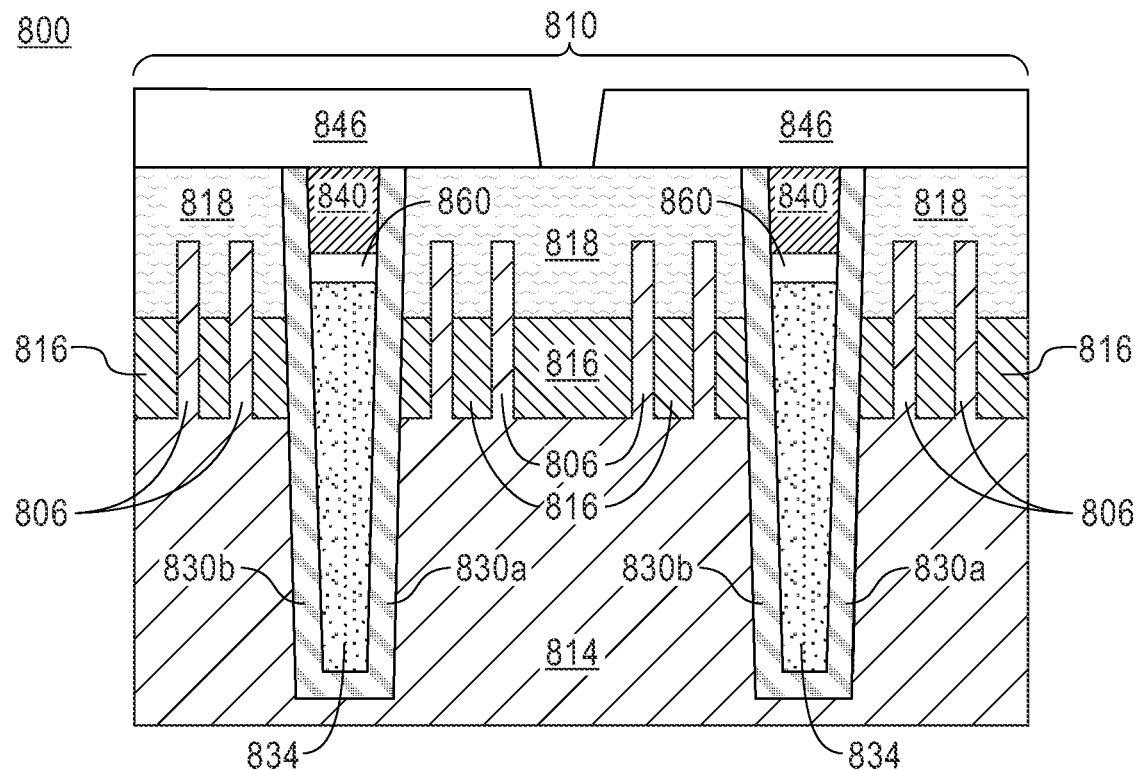
FIG. 11A is a schematic cross-sectional side view of the semiconductor structure of FIGS. 8A and 8B at a subsequent fabrication stage, in accordance with one embodiment of the present invention.
Figure 11B:
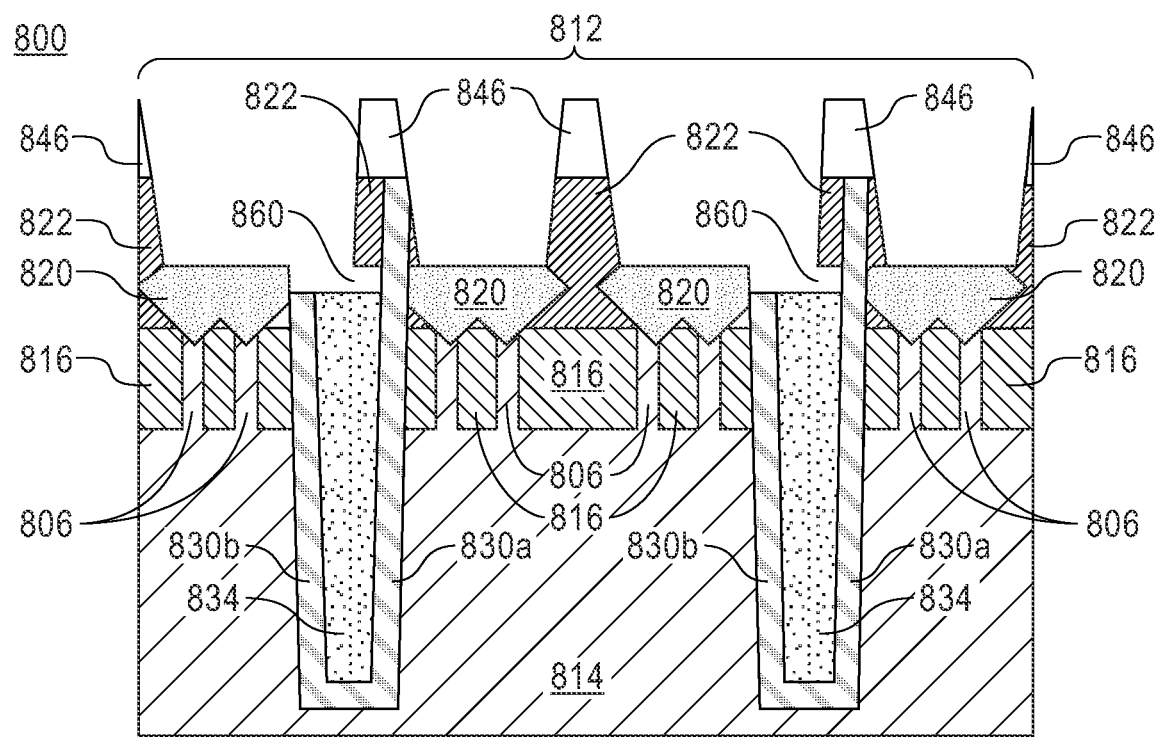
FIG. 11B is a schematic cross-sectional side view of the semiconductor structure of FIGS. 8A and 8B at the same fabrication stage as FIG. 11A, in accordance with one embodiment of the present invention.

FIGS. 11A and 11B are schematic cross-sectional side views of the semiconductor structure 800 of FIGS. 8A and 8B at a subsequent fabrication stage, in accordance with one embodiment of the present invention. The semiconductor structure 800 has the dielectric cap 854 etched away from between the dielectric fill 842 and the BPR 834 to form a horizontal extension gap 860. The horizontal extension gap 860 replaces the dielectric cap 854 near the contact openings, including the space in the S/D region 812 and, notably, the gate region 810. The dielectric cap 854 is removed with an etch selective process that does not etch the exposed portions of the ILD 822, 846, the S/Ds 820, the gate 818, the dielectric liners 820a, b, or the BPR 834.

Figure 12A:
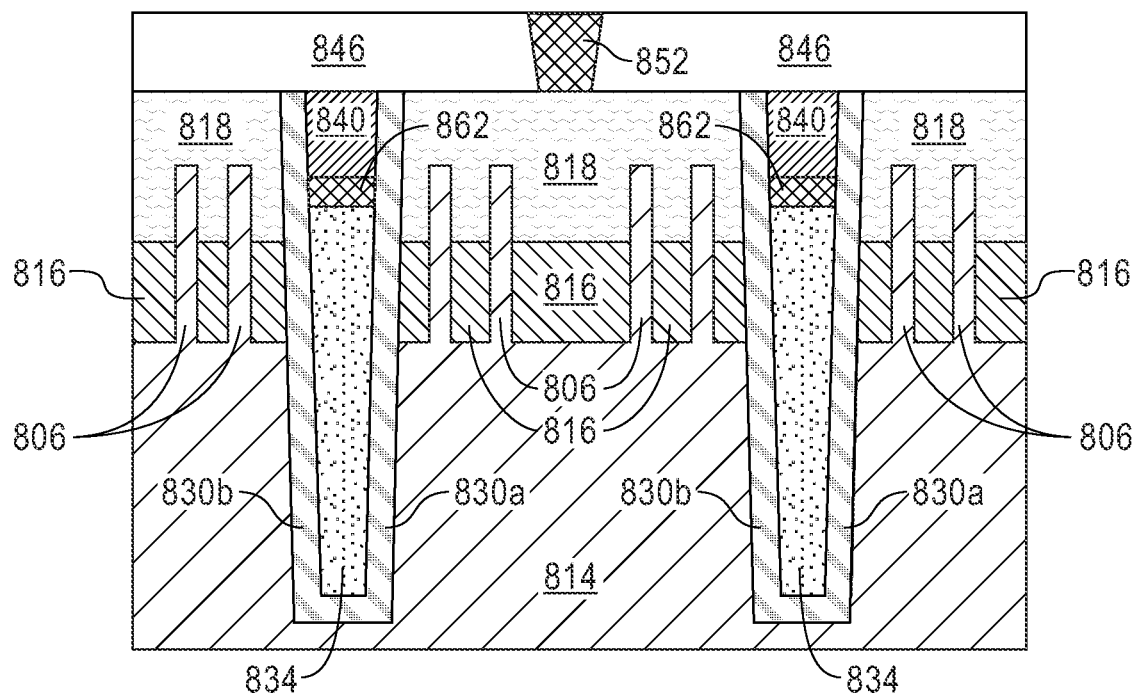
FIG. 12A is a schematic cross-sectional side view of the semiconductor structure of FIGS. 8A and 8B at a subsequent fabrication stage, in accordance with one embodiment of the present invention.
Figure 12B:
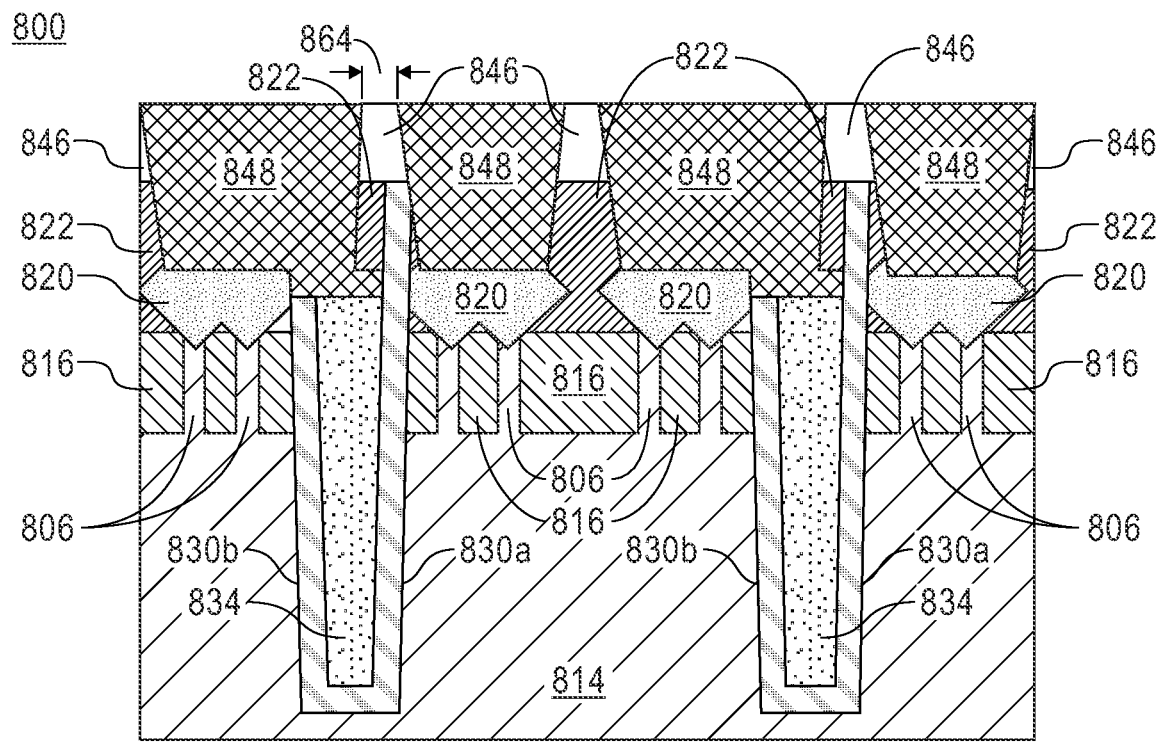
FIG. 12B is a schematic cross-sectional side view of the semiconductor structure of FIGS. 8A and 8B at the same fabrication stage as FIG. 12A, in accordance with one embodiment of the present invention.

FIGS. 12A and 12B are schematic cross-sectional side views of the semiconductor structure 800 of FIGS. 8A and 8B at a subsequent fabrication stage, in accordance with one embodiment of the present invention. The semiconductor structure 800 includes S/D contacts 848 and a gate contact 852 formed within the contact openings 856. The S/D contacts 848 include a horizontal metal extension 862 formed within the horizontal extension gap 860. The horizontal metal extension 862 extends from the S/D contact 848 over a top surface of the BPR 834 between the first dielectric liner and the second dielectric liner, and thereby increases the surface area connection between the S/D contact 848 and the BPR 834. The horizontal metal extension 862 may, in certain embodiments, cover the entire top surface of the BPR 834. This connection between the horizontal metal extension 862 and the BPR 834 decreases the likelihood of shorting between S/D contacts 848 since a distance 864 between the S/D contacts 848 can be increased without sacrificing the connection between the S/D contacts 848 and the BPR 834.

Figure 13A:
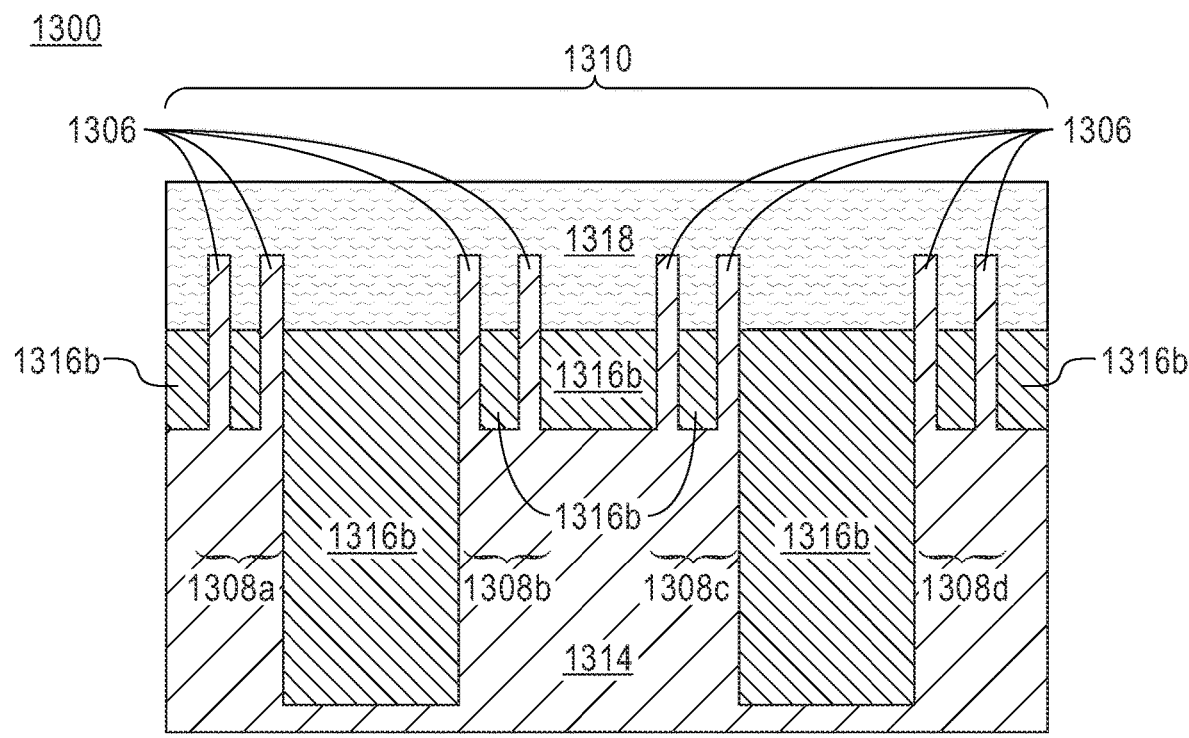
FIG. 13A is a schematic cross-sectional side view of a semiconductor structure at a fabrication stage, in accordance with one embodiment of the present invention.
Figure 13B:
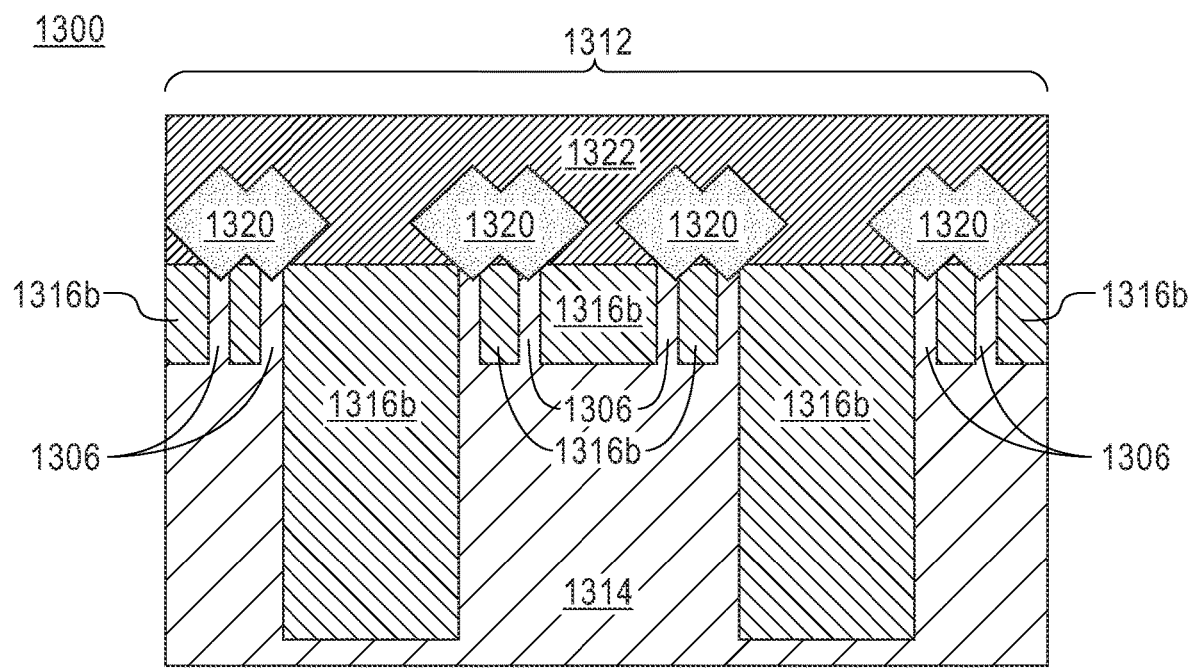
FIG. 13B is a schematic cross-sectional side view of the semiconductor structure of FIG. 13A, in accordance with one embodiment of the present invention.

FIGS. 13A and 13B are schematic cross-sectional side views of a semiconductor structure 1300 at a fabrication stage, in accordance with one embodiment of the present invention. FIG. 13A is a view of a gate region 1310, while FIG. 2B is a figure of a S/D region 1312. The semiconductor structure 1300 has fins 1306 that extend laterally through the gate region 1310 and the S/D region 1312 (i.e., into and out of the page). A substrate 1314 and shallow trench isolation (STI) 1316a, b also extend along the length of the semiconductor structure 1300 through the gate region 1310 and the S/D region 1312. Particular to the gate region 1310, the semiconductor structure 1300 may include a gate 1318 fabricated above the STI 1316a, b and the fins 1306. In the S/D region 1312 the semiconductor structure 1300 includes source/drains 1320, and interlayer dielectric (ILD) 1322. The annealing and curing for the gate 1318 and the S/Ds 1320 is completed previously, and the metal contamination, diffusion and wafer bowing that could occur due to the presence of a buried power rail have been avoided.

The semiconductor structure 1300 includes a deep STI 1316a and a shallow STI 1316b. Like the embodiment described above, the semiconductor structure 1300 includes FET regions 1308, with the deep STI 1316a located between like-doped FET regions. That is, the deep STI 1316a is located (i) between NFET regions 1308a and 1308b; and (ii) between PFET regions 1308c and 1308d. The deep STI 1316a at least partially overlaps the first dielectric liner 1330a and the second dielectric liner 1330b, and surrounds a lower portion of the BPR 1334 to isolate the BPR 1334 from the substrate 1314.

Figure 14A:
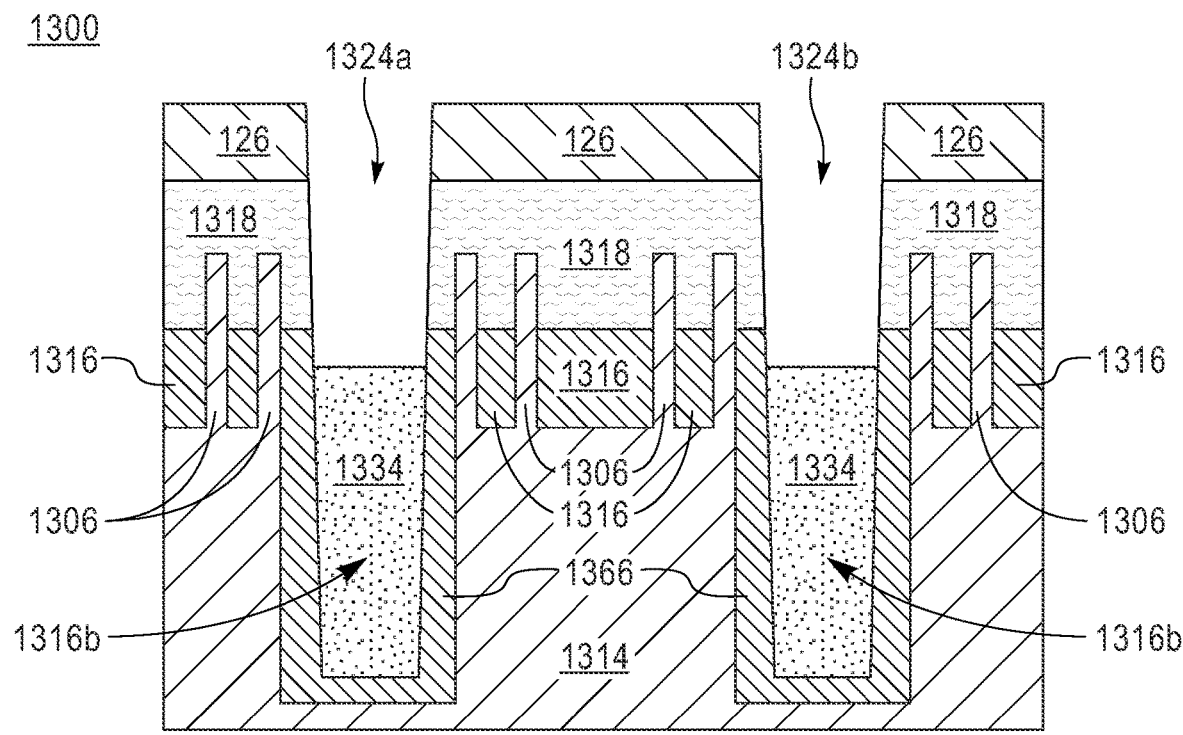
FIG. 14A is a schematic cross-sectional side view of the semiconductor structure of FIGS. 13A and 13B at a subsequent fabrication stage, in accordance with one embodiment of the present invention.
Figure 14B:
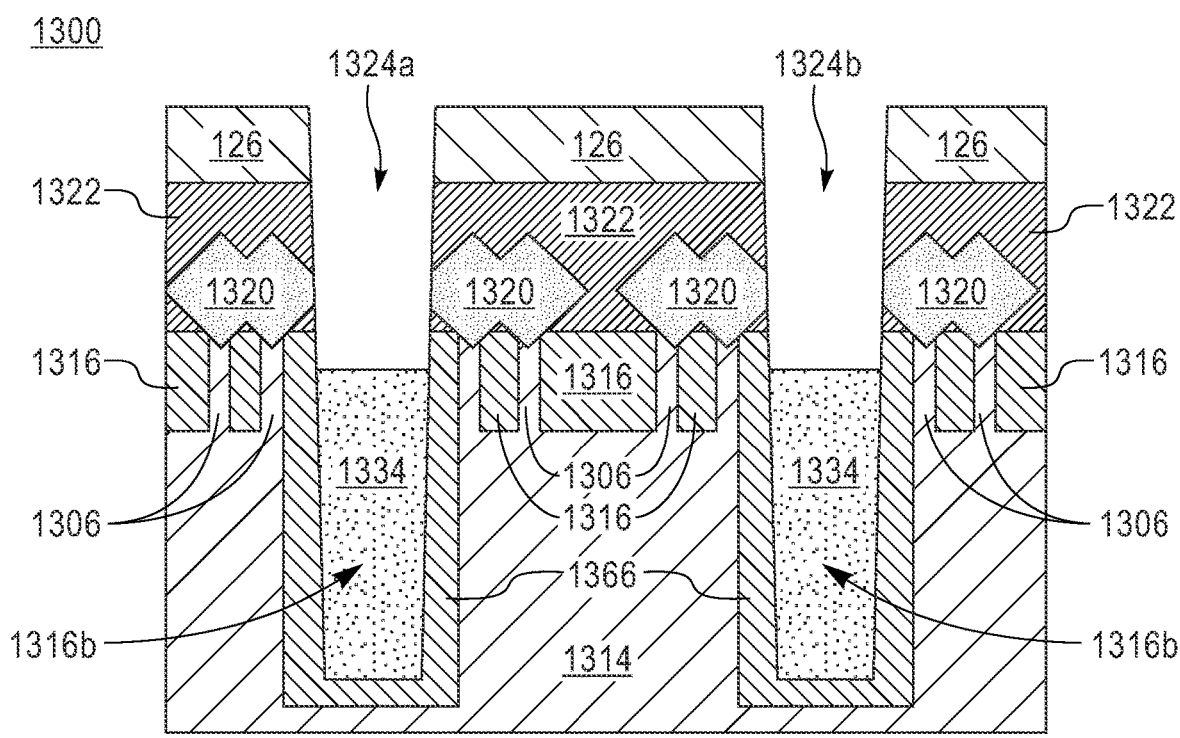
FIG. 14B is a schematic cross-sectional side view of the semiconductor structure of FIGS. 13A and 13B at the same fabrication stage as FIG. 14A, in accordance with one embodiment of the present invention.

FIGS. 14A and 14B are schematic cross-sectional side views of a semiconductor structure 1300 at a fabrication stage, in accordance with one embodiment of the present invention. The semiconductor structure 1300 has buried power rail (BPR) regions 1324a, b cut through the gate 1318, the ILD 1322, and into the deep STI 1316b. The BPR regions 1324a, b may also cut through portions of the S/Ds 1320. The BPR regions 1324a, b do not etch through to the substrate 1314, however, and a liner STI 1366 remains around the boundary of the BPR regions 1324a, b. Thus, when a BPR 1334 is formed inside the BPR regions 1324a, b, the liner STI 1366 isolates the BPR 1334 from the substrate 1314.

Figure 15A:
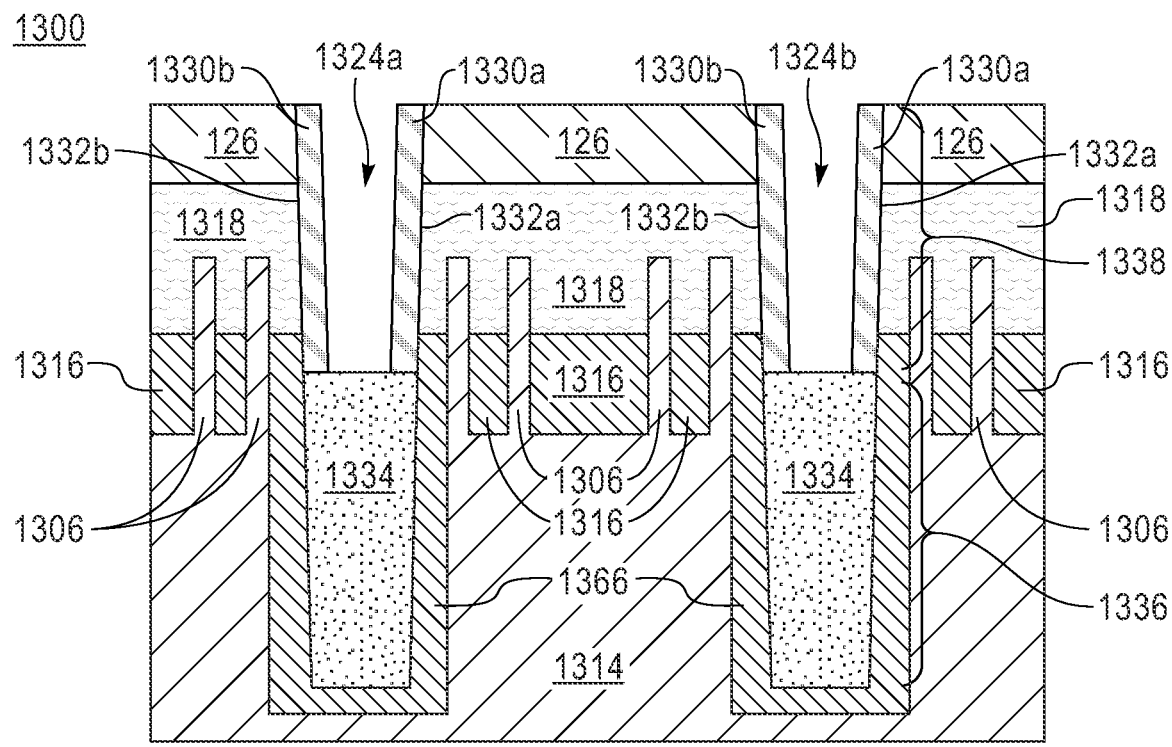
FIG. 15A is a schematic cross-sectional side view of the semiconductor structure of FIGS. 13A and 13B at a subsequent fabrication stage, in accordance with one embodiment of the present invention.
Figure 15B:
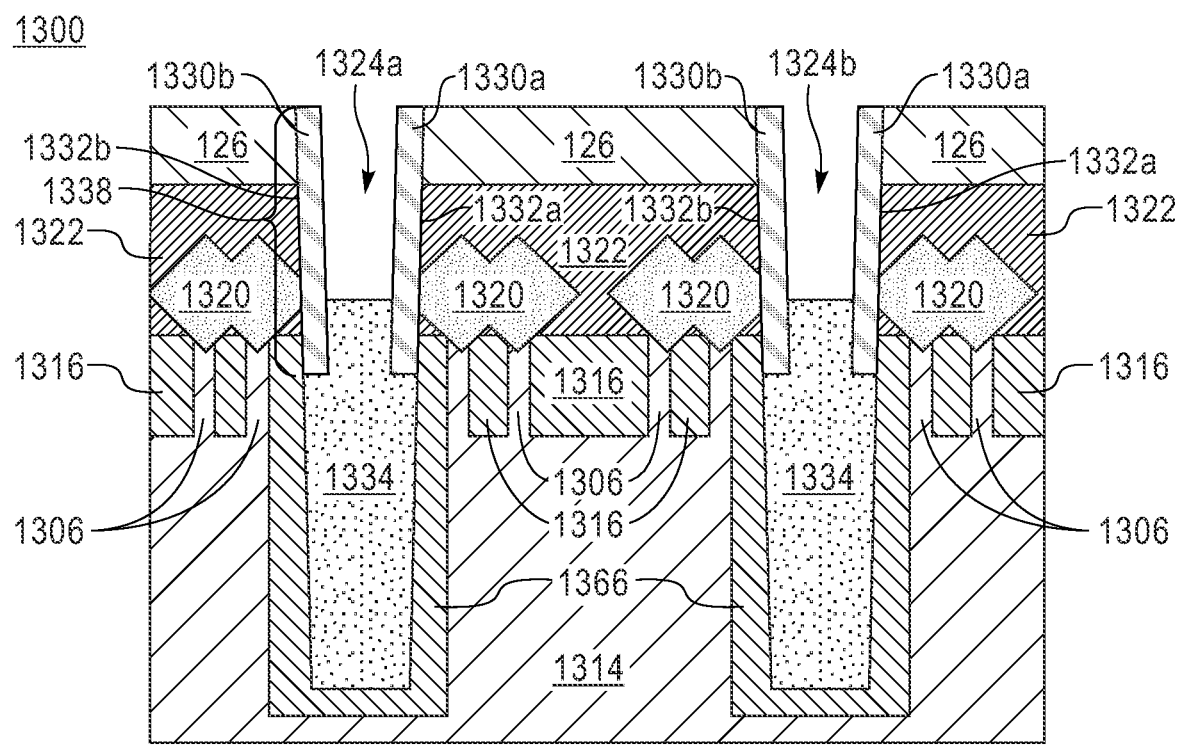
FIG. 15B is a schematic cross-sectional side view of the semiconductor structure of FIGS. 13A and 13B at the same fabrication stage as FIG. 15A, in accordance with one embodiment of the present invention.

FIGS. 15A and 15B are schematic cross-sectional side views of the semiconductor structure 1300 of FIGS. 13A and 13B at a subsequent fabrication stage, in accordance with one embodiment of the present invention. The semiconductor structure 1300 includes a first dielectric liner 1330a on a first side 1332a of each BPR region 1324a, b, a second dielectric liner 1330b on a second side 1332b of each BPR region 1324a, b. As illustrated, the first dielectric liner 1330a and the second dielectric liner 1330b are located only at an upper portion 1338 of the BPR regions 1324a, b, but the BPR 1334 is still isolated from the substrate 1314 by the liner STI 1366 at a lower portion 1336 of the BPR regions 1324a, b.

Figure 16A:
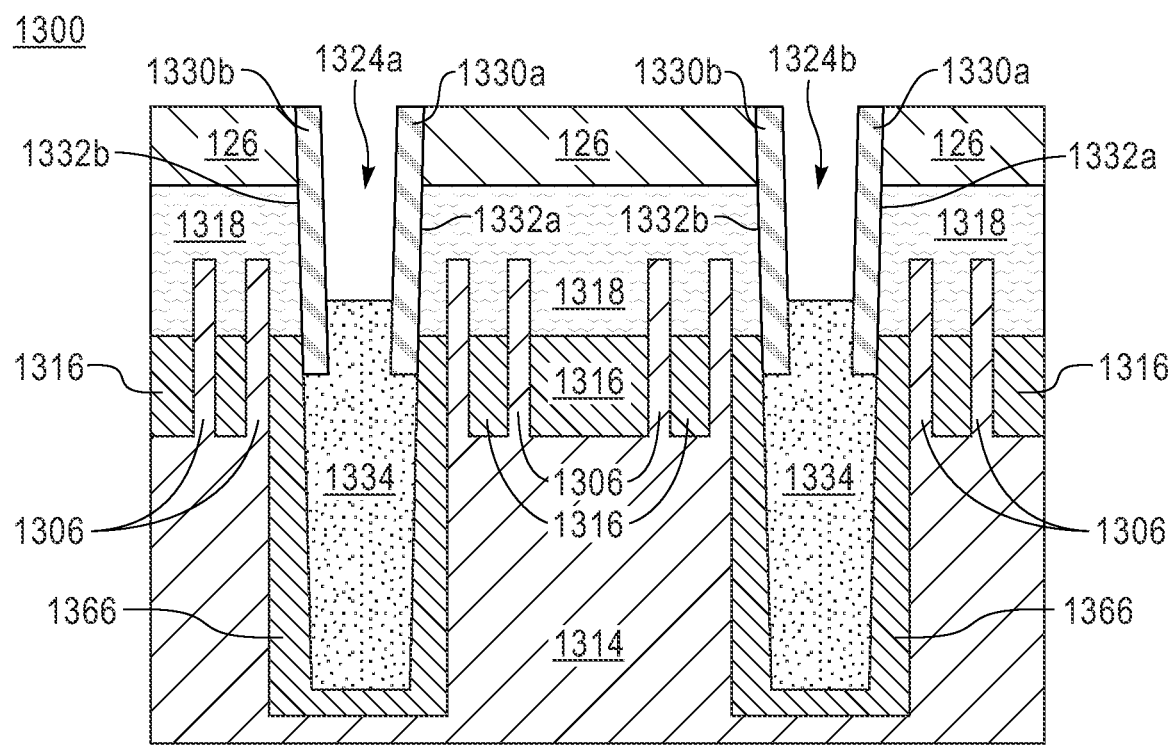
FIG. 16A is a schematic cross-sectional side view of the semiconductor structure of FIGS. 13A and 13B at a subsequent fabrication stage, in accordance with one embodiment of the present invention.
Figure 16B:
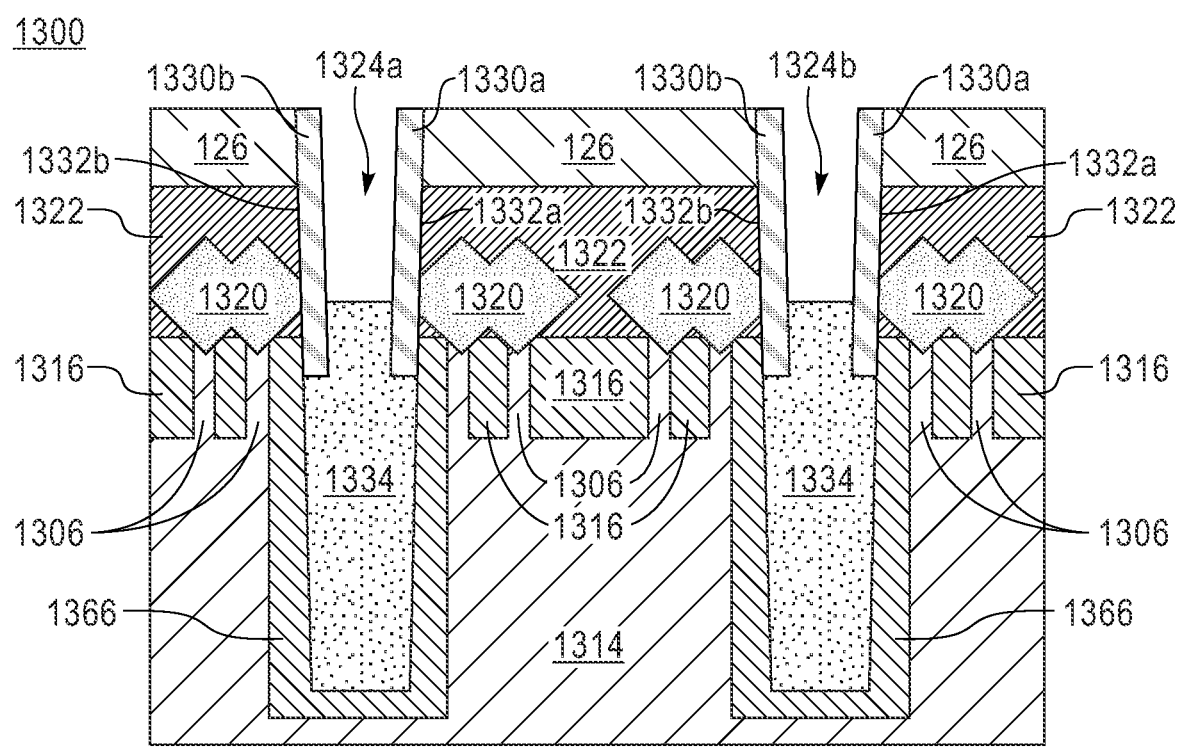
FIG. 16B is a schematic cross-sectional side view of the semiconductor structure of FIGS. 13A and 13B at the same fabrication stage as FIG. 16A, in accordance with one embodiment of the present invention.

FIGS. 16A and 16B are schematic cross-sectional side views of the semiconductor structure of FIGS. 13A and 13B at a subsequent fabrication stage, in accordance with one embodiment of the present invention. The semiconductor structure 1300 shows additional BPR 1368 formed between the first dielectric liner 1330a and the second dielectric liner 1330b such that at the gate region 1310 the first dielectric liner 1330a separates the BPR 1334, 1368 from a first gate 1318a, and at the S/D region 1312 the first dielectric liner 1330a separates the BPR 1334, 1368 from a first S/D 1320.

Figure 17A:
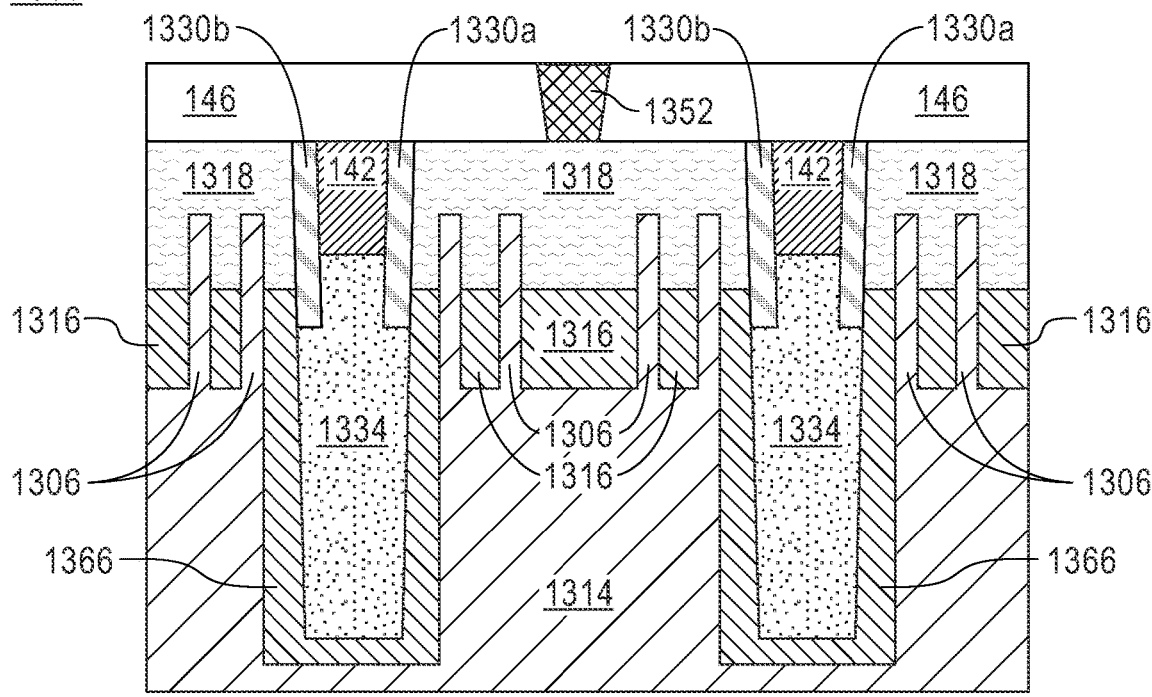
FIG. 17A is a schematic cross-sectional side view of the semiconductor structure of FIGS. 13A and 13B at a subsequent fabrication stage, in accordance with one embodiment of the present invention.
Figure 17B:
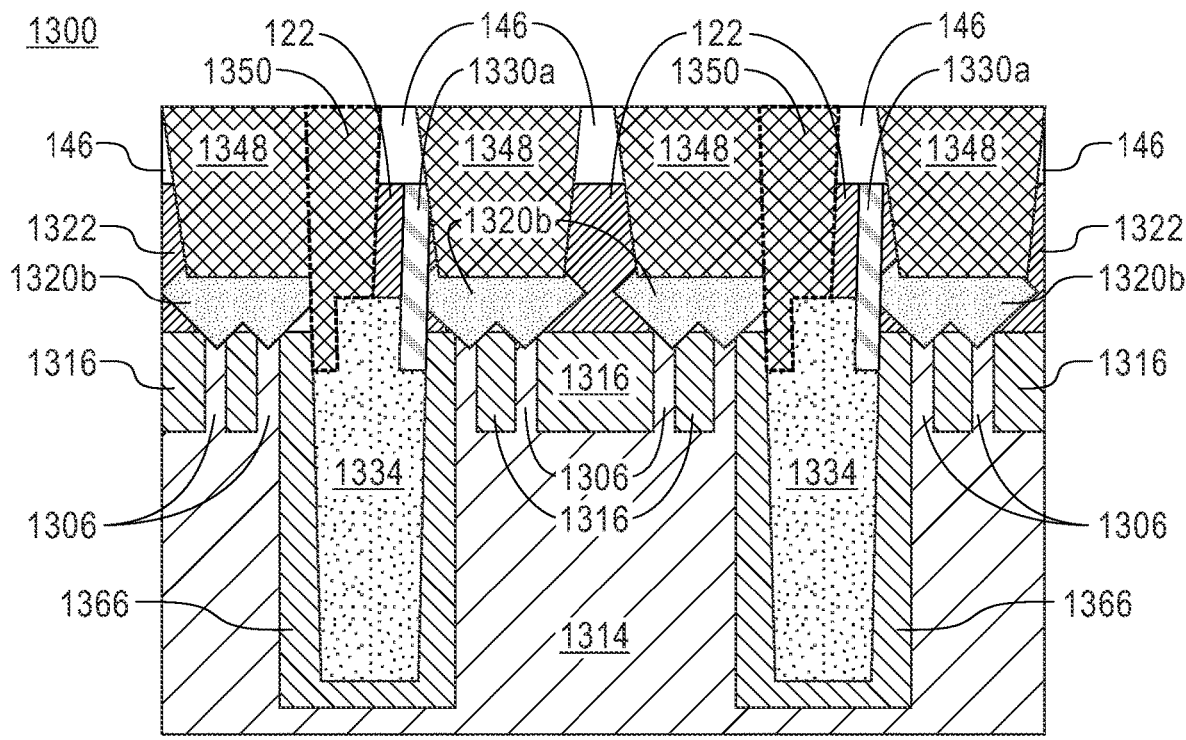
FIG. 17B is a schematic cross-sectional side view of the semiconductor structure of FIGS. 13A and 13B at the same fabrication stage as FIG. 17A, in accordance with one embodiment of the present invention.

FIGS. 17A and 18B are schematic cross-sectional side views of the semiconductor structure of FIGS. 13A and 13B at a subsequent fabrication stage, in accordance with one embodiment of the present invention. The semiconductor structure 1300 shows S/D contacts 1348, BPR contacts 1350, and a gate contact 1352 formed over the BPR 1334. The S/D contacts 1348 replace a portion of the second dielectric liner 1330b lining the second lateral side 1332b of the BPR region 1324a, b such that at the S/D region 1312, a second S/D 1320b contacts the BPR 1334 from outside the BPR region 1324a, b. The second S/D 1320b contacts the upper portion of the BPR 1334 and, in certain embodiments, contact the lower portion of the BPR 1334.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first source/drain (S/D) connected to a first field-effect transistor (FET) region;
a second S/D connected to a second FET region;
a buried power rail (BPR) region extending laterally in a first direction, and located between the first FET region and the second FET region, comprising:
a buried power rail (BPR);
a first dielectric liner lining a first lateral side of the BPR region, wherein the first dielectric liner isolates the BPR from the first FET region and the first S/D;
a second dielectric liner lining a second lateral side of the BPR region, wherein the second dielectric liner isolates the BPR from the second FET region; and
a contact electrically connecting the second S/D and the BPR through the second lateral side of the BPR region, wherein the first dielectric liner extends higher than the second dielectric liner in the BPR region.

2. The semiconductor structure of claim 1, wherein the first FET region and the second FET region are devices with a first polarity selected from the group consisting of: a PFET and an NFET.

3. The semiconductor structure of claim 1, wherein the first dielectric liner and the second dielectric liner connect below the BPR to isolate a lower portion of the BPR from a substrate.

4. The semiconductor structure of claim 1, further comprising a horizontal metal extension, wherein the horizontal metal extension extends from the contact over a top surface of the BPR between the first dielectric liner and the second dielectric liner.

5. The semiconductor structure of claim 1, further comprising a gate region adjacent to the first FET region and the second FET region along the BPR in the first direction, wherein at the gate region the first dielectric liner separates the BPR from a first gate, and the second dielectric liner separates the BPR from a second gate.

6. The semiconductor structure of claim 5, further comprising:
an interlayer dielectric (ILD) between the first dielectric liner and the second dielectric liner; and
a horizontal metal extension located between the ILD and the BPR.

7. A method, comprising:
forming a first gate and a second gate in a gate region of a semiconductor structure;
forming a first source/drain (S/D) and a second S/D in a S/D region adjacent to the gate region;
etching a buried power rail (BPR) region between the first gate and the second gate and between the first S/D and the second S/D;
forming a first dielectric liner lining a first lateral side of the BPR region;
forming a second dielectric liner lining a second lateral side of the BPR region;
forming a BPR between the first dielectric liner and the second dielectric liner;
forming a contact opening through the second dielectric liner in the S/D region and at least part of the second S/D.

8. The method of claim 7, further comprising:
forming a first fin field-effect transistor (FET) of a first doping type before forming the first gate above the first fin FET; and
forming a second fin FET of the first doping type before forming the second gate above the second fin FET.

9. The method of claim 7, wherein the first dielectric liner and the second dielectric liner line a lower portion of the BPR region to isolate the BPR from a substrate.

10. The method of claim 7, further comprising:
recessing the BPR from an interlayer dielectric (ILD) portion at a top of the BPR;
forming an ILD in the ILD portion before cutting the contact.

11. The method of claim 10, further comprising:
forming a first dielectric cap above the BPR before forming the ILD;
etching the first dielectric cap after cutting the contact to form a horizontal metal extension region; and
metalizing the horizontal metal extension region to form a horizontal metal extension.

12. A semiconductor structure, comprising:
a gate region comprising a first dielectric liner between a first gate and a buried power rail (BPR), and a second dielectric liner between a second gate and the BPR;
a source/drain (S/D) region comprising the first dielectric liner between a first source/drain (S/D) and the BPR, and a second S/D contacting the BPR; and
a horizontal metal extension of the second S/D, wherein the horizontal metal extension contacts an interior side of the first dielectric liner.

13. The semiconductor structure of claim 12, wherein the gate region further comprises an interlayer dielectric (ILD) between the first dielectric liner and the second dielectric liner, wherein the horizontal metal extension is located between the ILD and the BPR.

14. The semiconductor structure of claim 12, wherein the first dielectric liner and the second dielectric liner isolate a lower portion of the BPR from a substrate.

15. The semiconductor structure of claim 12, wherein the gate region is adjacent to the S/D region along the BPR.

16. A semiconductor structure, comprising:
a first field-effect transistor (FET) region comprising a first source/drain (S/D) contact;
a second FET region comprising a second S/D contact;
a deep shallow trench isolation (STI) between the first FET region and the second FET region; and
a buried power rail (BPR), wherein a lower portion of the BPR is isolated from the first FET region and the second FET region by the deep STI an upper portion of the BPR is isolated from the first S/D contact by a first dielectric liner, and the upper portion of the BPR contacts the second S/D contact, and the first dielectric liner isolates the upper portion of the BPR from a first gate, and a second dielectric liner isolates the upper portion of the BPR from a second gate.

17. The semiconductor structure of claim 16, wherein the lower portion of the BPR contacts the second S/D contact.

* * * * *